United States Patent
Suh et al.

(10) Patent No.: US 11,955,449 B2
(45) Date of Patent: Apr. 9, 2024

(54) STACKED SEMICONDUCTOR PACKAGE

(71) Applicant: SAMSUNG ELECTRONICS CO., LTD., Suwon-si (KR)

(72) Inventors: Jihwan Suh, Suwon-si (KR);
Un-Byoung Kang, Hwaseong-si (KR);
Taehun Kim, Cheonan-si (KR);
Hyuekjae Lee, Hwaseong-si (KR);
Jihwan Hwang, Hwaseong-si (KR);
Sang Cheon Park, Hwaseong-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

(21) Appl. No.: 18/054,530

(22) Filed: Nov. 10, 2022

(65) Prior Publication Data

US 2023/0076511 A1    Mar. 9, 2023

Related U.S. Application Data

(63) Continuation of application No. 16/992,895, filed on Aug. 13, 2020, now Pat. No. 11,508,685.

(30) Foreign Application Priority Data

Oct. 23, 2019  (KR) .................... 10-2019-0132171

(51) Int. Cl.
*H01L 23/00* (2006.01)
*H01L 25/065* (2023.01)
*H01L 25/18* (2023.01)

(52) U.S. Cl.
CPC ............. *H01L 24/32* (2013.01); *H01L 24/03* (2013.01); *H01L 24/08* (2013.01); *H01L 24/27* (2013.01);
(Continued)

(58) Field of Classification Search
CPC ........ H10B 80/00; H10K 19/00; H10K 39/10; H10K 59/90; H10K 59/95; H10K 65/00;
(Continued)

(56) References Cited

U.S. PATENT DOCUMENTS 7,479,702 B2   1/2009  Uang et al.
8,169,060 B2   4/2012  Barth et al.
(Continued)

FOREIGN PATENT DOCUMENTS

TW   200719358   5/2007
TW   201822311   6/2018

OTHER PUBLICATIONS

Zhen Song, et al., "Void-Free BCB Adhesive Wafer Bonding With High Alignment Accuracy," Microsyst Technol (2015) 21:1633-1641.

*Primary Examiner* — Jasmine J Clark
(74) *Attorney, Agent, or Firm* — F. CHAU & ASSOCIATES, LLC

(57) ABSTRACT

A semiconductor package includes a substrate, a first semiconductor chip disposed on the substrate, and a second semiconductor chip disposed on a top surface of the first semiconductor chip. The first semiconductor chip includes a conductive pattern disposed on the top surface of the first semiconductor chip and a first protective layer covering the top surface of the first semiconductor chip and at least partially surrounds the conductive pattern. The second semiconductor chip includes a first pad that contacts a first through electrode on a bottom surface of the second semiconductor chip. A second protective layer surrounds the first pad and covers the bottom surface of the second semiconductor chip. A third protection layer fills a first recess defined in the second protective layer to face the inside of the second
(Continued)

protective layer. The first protective layer and the third protective layer contact each other.

20 Claims, 17 Drawing Sheets

(52) U.S. Cl.
CPC .......... *H01L 25/0657* (2013.01); *H01L 25/18* (2013.01); *H01L 2224/0346* (2013.01); *H01L 2224/08146* (2013.01); *H01L 2224/32059* (2013.01); *H01L 2224/3207* (2013.01); *H01L 2224/32145* (2013.01); *H01L 2224/33181* (2013.01); *H01L 2225/06541* (2013.01); *H01L 2225/06565* (2013.01); *H01L 2225/06586* (2013.01)

(58) Field of Classification Search
CPC ........ H10N 19/00; H10N 39/00; H10N 59/00; H10N 69/00; H10N 79/00; H10N 89/00; H01L 24/32; H01L 24/03; H01L 24/08; H01L 24/27; H01L 25/0657; H01L 25/18
USPC ........................................................ 257/621
See application file for complete search history.

(56) References Cited

U.S. PATENT DOCUMENTS

| | | |
|---|---|---|
| 8,697,493 B2 | 4/2014 | Sadaka |
| 8,841,777 B2 | 9/2014 | Farooq et al. |
| 9,093,379 B2 | 7/2015 | Guillorn et al. |
| 9,653,623 B2 | 5/2017 | Hong et al. |
| 9,721,930 B2 * | 8/2017 | Lee .................... H01L 25/50 |
| 9,960,129 B2 | 5/2018 | Liu et al. |
| 10,068,876 B2 | 9/2018 | Kabe et al. |
| 10,141,391 B2 | 11/2018 | Yang |
| 10,872,836 B2 | 12/2020 | Yu et al. |
| 2009/0189256 A1 | 7/2009 | Yoshimura et al. |
| 2011/0169159 A1 | 7/2011 | Lin et al. |
| 2013/0262399 A1 | 9/2013 | Leduc |
| 2015/0179280 A1 | 6/2015 | Kilmer et al. |
| 2016/0293567 A1 | 10/2016 | Liu et al. |
| 2018/0033779 A1 | 2/2018 | Park et al. |
| 2018/0061767 A1 | 3/2018 | Chiang et al. |
| 2018/0188749 A1 | 6/2018 | Yu et al. |
| 2019/0057974 A1 | 2/2019 | Lu et al. |
| 2019/0096842 A1 | 3/2019 | Fountain, Jr. et al. |
| 2019/0109042 A1 | 4/2019 | Katkar et al. |
| 2019/0157333 A1 | 5/2019 | Tasi |
| 2021/0125955 A1 | 4/2021 | Suh et al. |

* cited by examiner

STACKED SEMICONDUCTOR PACKAGE

CROSS-REFERENCE TO RELATED APPLICATIONS

This U.S. non-provisional patent application is a Continuation of co-pending U.S. patent application Ser. No. 16/992,895, filed on Aug. 13, 2020, issued as U.S. Pat. No. 11,508,685 on Nov. 22, 2022, which claims priority under 35 U.S.C, § 119 of Korean Patent Application No. 10-2019-0132171, filed on Oct. 23, 2019, the entire contents of which are hereby incorporated by reference.

TECHNICAL FIELD

The present disclosure relates to a semiconductor package, and more particularly, to a stack type semiconductor package.

DISCUSSION OF THE RELATED ART

In response to demand for increased miniaturization of high-speed, multifunctional electronic devices, recent packaging technologies are progressing toward mounting a plurality of semiconductor chips in a single package.

In order to miniaturize electronic components, the size of individual mounted components is reduced and also, a plurality of individual devices are integrated into a single package. However, it may be difficult to integrate multiple miniaturized semiconductors that handle high frequency signals into a single package while maintaining excellent electrical characteristics.

SUMMARY

A semiconductor package includes a substrate, a first semiconductor chip mounted on the substrate, and a second semiconductor chip mounted on a top surface of the first semiconductor chip. The first semiconductor chip includes a conductive pattern disposed on the top surface of the first semiconductor chip, and a first protective layer covering the top surface of the first semiconductor chip and at least partially surrounding the conductive pattern. The second semiconductor chip includes a first pad contacting the conductive pattern on a bottom surface of the second semiconductor chip, a second protective layer at least partially surrounding the first pad and covering the bottom surface of the second semiconductor chip, and a third protective layer filling a first recess which is defined in the second protective layer to face the inside of the second protective layer. The first protective layer and the third protective layer contact each other.

A semiconductor package includes a substrate, and semiconductor chips stacked on the substrate. Each of the semiconductor chips includes a chip pad disposed on an activation surface of the semiconductor chip disposed to face the substrate, a first protective layer covering the activation surface and at least partially surrounding the chip pad, the first protective layer including a recess therein. A second protective layer fills the inside of the recess. A through electrode vertically passes through the semiconductor chips so as to be connected to the chip pad. A bottom surface of the second protective layer is coplanar with a bottom surface of the chip pad. The second protective layer contacts a side surface of the chip pad.

A semiconductor package includes a substrate. A connection terminal is disposed on a bottom surface of the substrate. First semiconductor chips are stacked on a top surface of the substrate. A second semiconductor chip is horizontally spaced apart from the first semiconductor chips and is mounted on the substrate. A molding layer covers the first semiconductor chips and the second semiconductor chip on the substrate. Each of the first semiconductor chips includes a chip pad disposed on a bottom surface of the first semiconductor chip, a through electrode that vertically passes through the first semiconductor chip and is connected to the chip pad, a first protective layer covering the bottom surface of the first semiconductor chip, the first protective layer including a recess, a second protective layer filling the recess, and a third protective layer covering a top surface of the first semiconductor chip. The second protective layer has a top surface that is rounded upward toward the first semiconductor chip.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, a semiconductor package according to the concept of the inventive concept will be described with reference to the accompanying drawings.

Figure 1A:
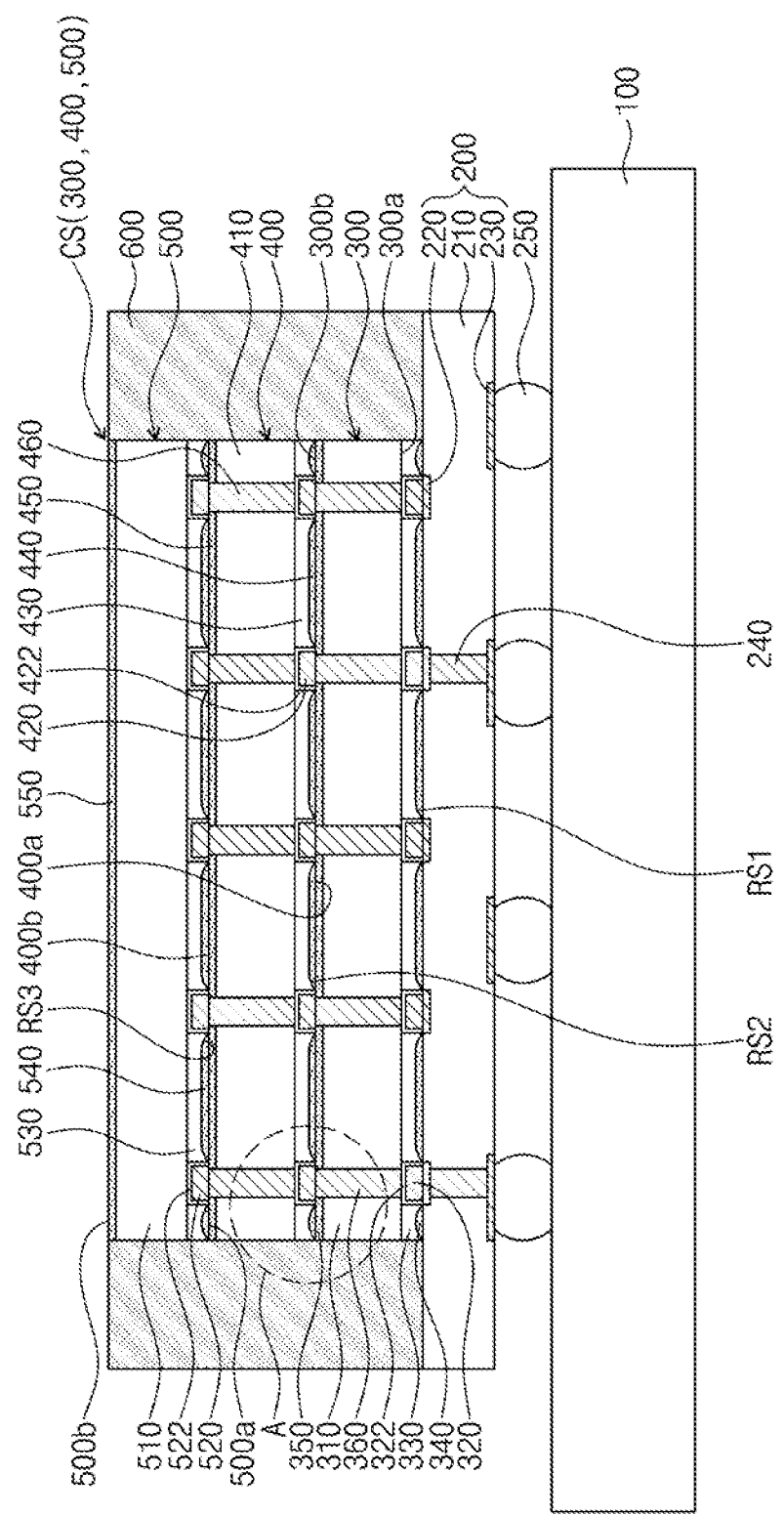
FIGS. 1A and 1B are cross-sectional views illustrating a semiconductor package according to embodiments of the inventive concept.
Figure 1B:
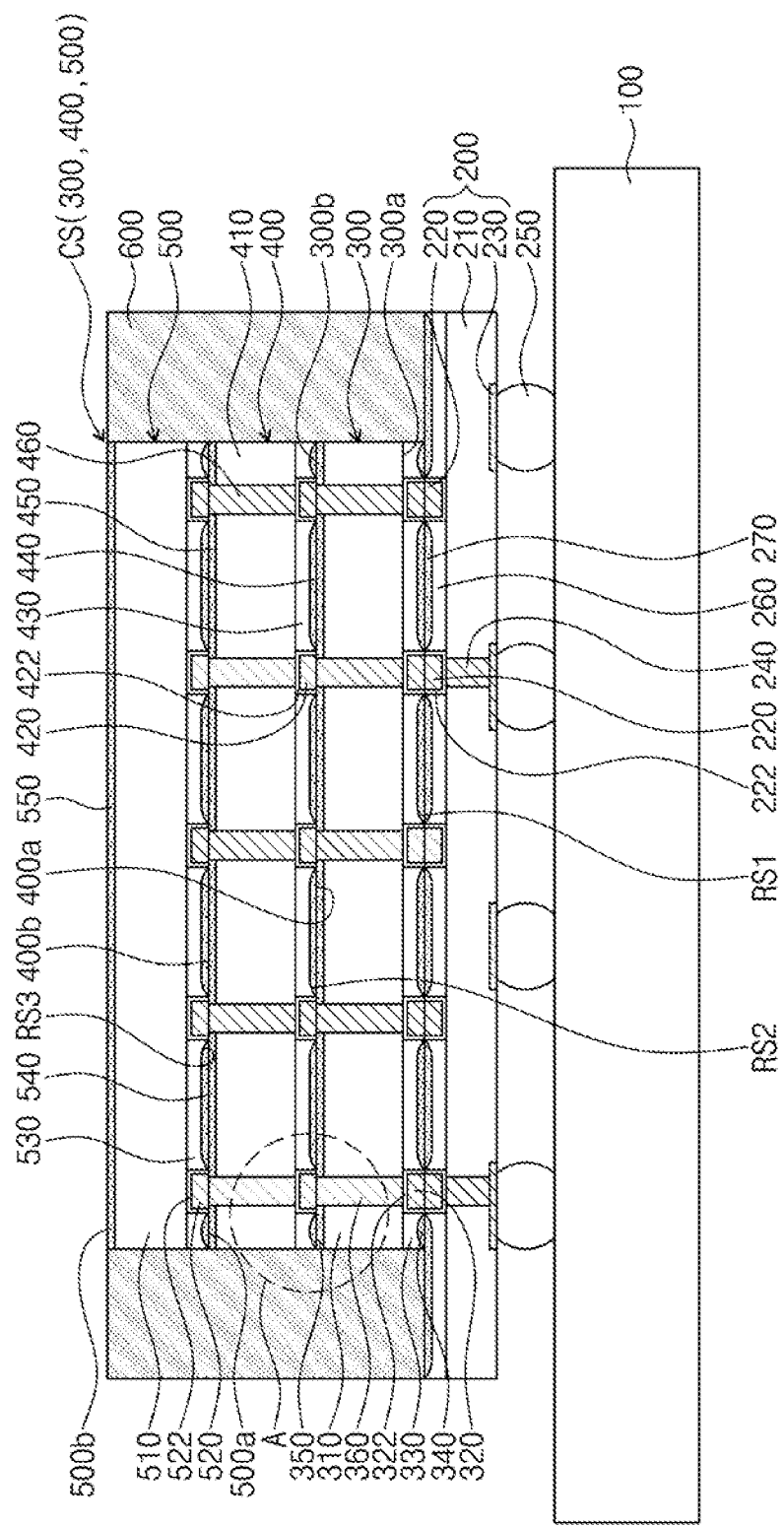
Figure 2A:
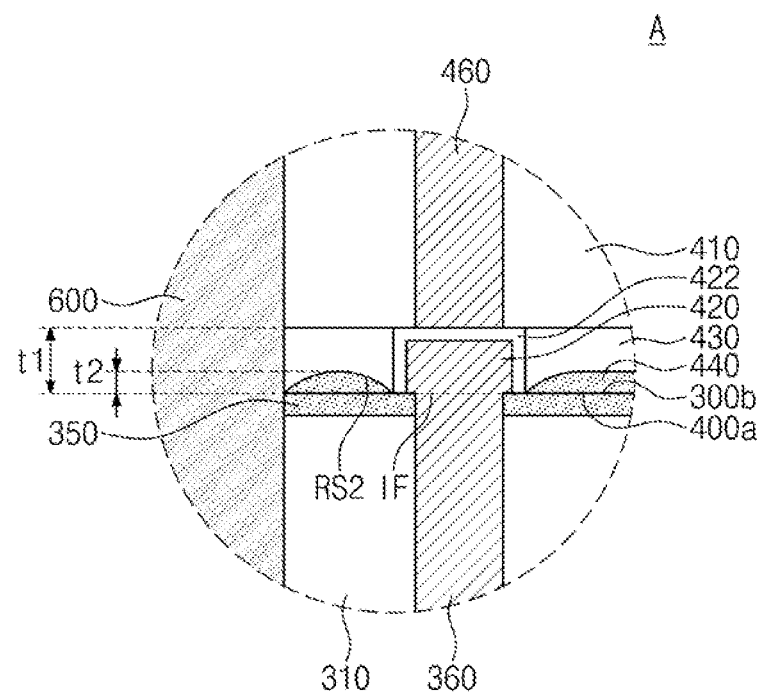
FIGS. 2A to 2C are partial enlarged view of FIG. 1A.
Figure 2B:
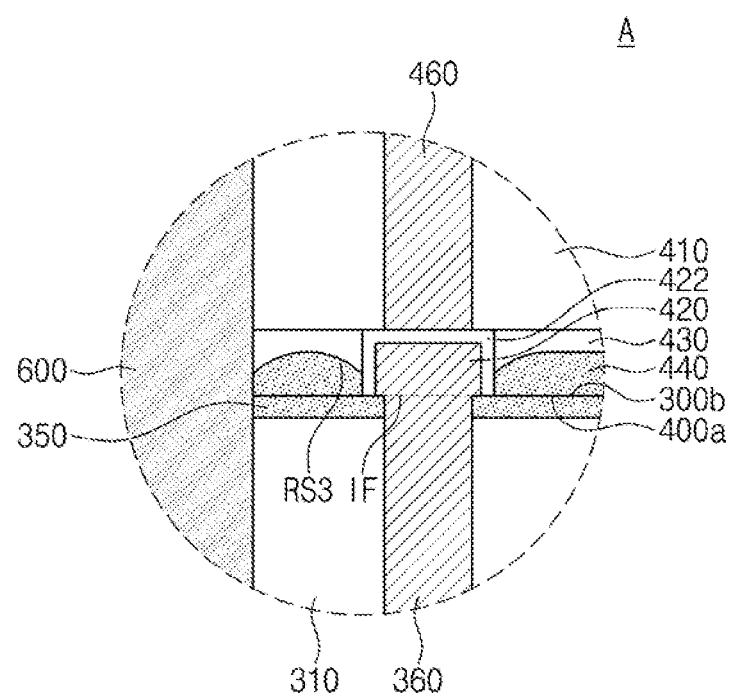
Figure 2C:
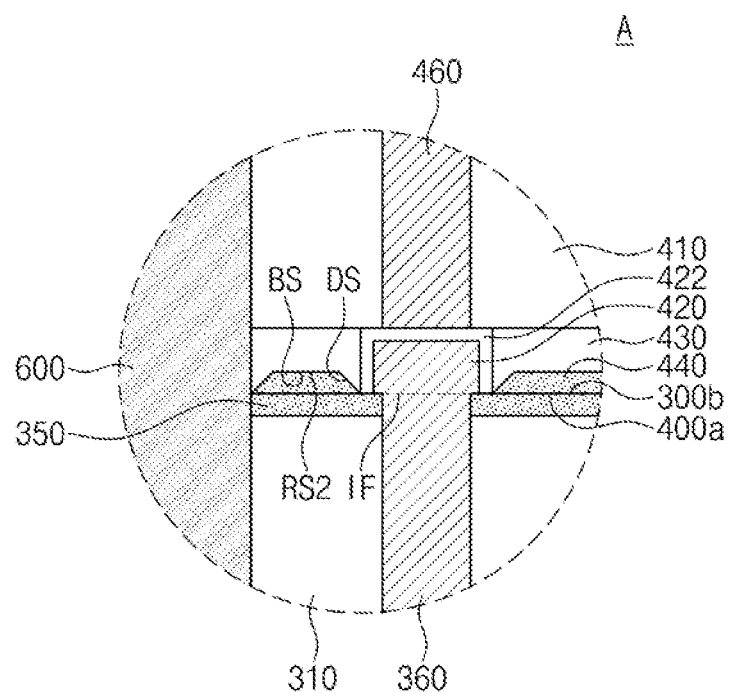
Figure 3:
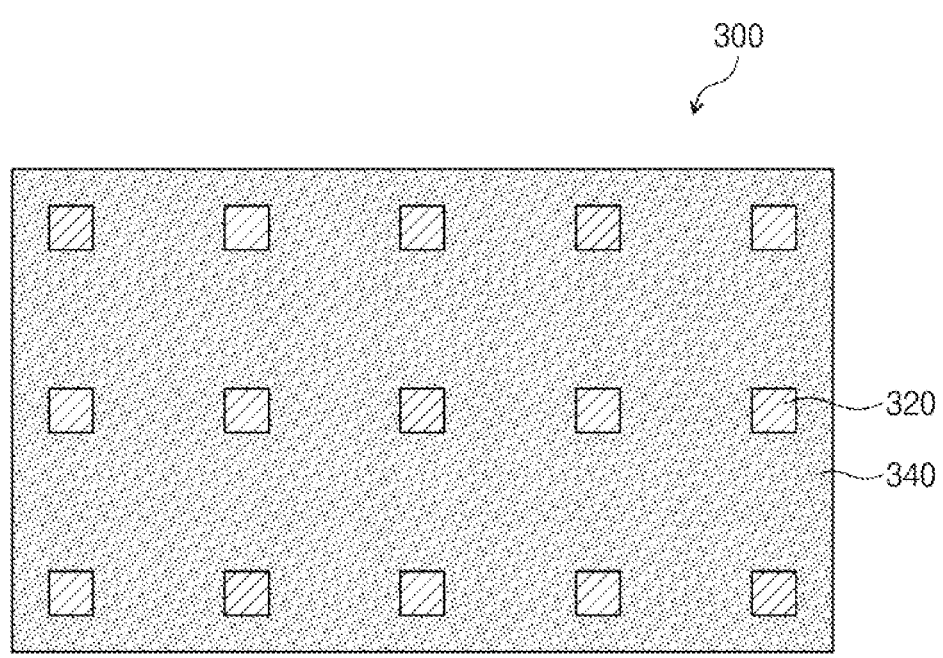
FIG. 3 is a plan view illustrating a semiconductor chip of FIG. 1A.

FIGS. 1A and 1B are cross-sectional views illustrating a semiconductor package according to embodiments of the inventive concept. FIGS. 2A to 2C are partial enlarged view of FIG. 1A and illustrate an area A of FIG. 1A. FIG. 3 is a plan view illustrating a semiconductor chip of FIG. 1A and illustrate a bottom surface of a first semiconductor chip.

Referring to FIGS. 1A, 2, and 3, a package substrate 100 may be provided. For example, the package substrate 100 may include a printed circuit board (PCB) having a signal pattern on a top surface thereof. Alternatively, the package substrate 100 may have a structure in which an insulation layer and a line layer are alternately stacked. The package substrate 100 may include pads disposed on the top surface thereof.

External terminals may be disposed below the package substrate 100. For example, the external terminals may be disposed on terminal pads disposed on a bottom surface of the package substrate 100. The external terminals may include a solder ball or solder bump, and the semiconductor package may be provided in the form of a ball grid array (BGA), a fine ball-grid array (FBGA) or a land grid array (LGA) according to the type and arrangement of the external terminals.

An interposer substrate 200 may be provided on the package substrate 100. The interposer substrate 200 may be mounted on the top surface of the package substrate 100. The interposer substrate 200 may include a base layer 210 and line patterns 220, 230, and 240 disposed on the base layer 210. For example, the line patterns 220, 230, and 240 may include first substrate pads 220 exposed on a top surface of the base layer 210, second substrate pads exposed on a bottom surface of the base layer 210, and substrate through electrodes 240 that vertically passes through the base layer 210 to electrically connect the first substrate pads 220 to the second substrate pads 230. In this case, top surfaces of the first substrate pads 220 may be coplanar with the top surface of the base layer 210. The first substrate pads 220 may be omitted, as necessary. In this case, the substrate through electrodes 240 may be exposed to the top surface of the base layer 210. The interposer substrate 200 may redistribute a chip stack CS, which will be described later. For example, the first substrate pads 220 and the second substrate pads 230 may be electrically connected by circuit lines within the base layer 210 and may constitute a redistribution circuit, together with the circuit lines. Each of the first substrate pads 220, the second substrate pads 230, and the substrate through electrodes 240 may include a conductive material such as a metal. For example, each of the first substrate pads 220, the second substrate pads 230, and the substrate through electrodes 240 may include copper (Cu).

Substrate connection terminals 250 may be disposed on a bottom surface of the interposer substrate 200. The substrate connection terminals 250 may be provided between the pads of the package substrate 100 and the second substrate pads 230 of the interposer substrate 200. The substrate connection terminals 250 may electrically connect the interposer substrate 200 to the package substrate 100. For example, the interposer substrate 200 may be mounted on the package substrate 100 in a flip chip manner. Each of the substrate connection terminals 250 may include a solder ball or a solder bump.

In FIG. 1A, the interposer substrate 200 is mounted on the package substrate 100, but the inventive concept is not necessarily limited thereto. In some embodiments, the package substrate 100 may be omitted, as necessary. For example, the semiconductor chips 300, 400, and 500 and a molding layer 600, which will be described later, may be disposed on a top surface of the interposer substrate 200, and external terminals that connect the semiconductor package to external devices may be disposed on a bottom surface of the interposer substrate 200. The external terminals may be the same as or similar to those described above. Hereinafter, the description will be continued based on the semiconductor package of FIG. 1A provided with the package substrate 100 below the interposer substrate 200.

The chip stack CS may be disposed on the interposer substrate 200. The chip stack CS may include a first semiconductor chip 300 mounted on the interposer substrate 200, at least one second semiconductor chip 400 stacked on the first semiconductor chip 300, and a third semiconductor chip 500 stacked on the second semiconductor chip 400 and located at the uppermost end of the chip stack CS. Each of the first to third semiconductor chips 300, 400, and 500 may be a memory chip such as a DRAM, an SRAM, an MRAM, or a flash memory. Alternatively, each of the first to third semiconductor chips 300, 400, and 500 may be a logic chip. Although one chip stack CS is illustrated as being provided in FIG. 1A, the inventive concept is not necessarily limited thereto. When a plurality of chip stacks CS is provided, the chip stacks CS may be spaced apart from each other on the interposer substrate 200.

The first semiconductor chip 300 may be mounted on the interposer substrate 200. The first semiconductor chip 300 may include a semiconductor material such as silicon (Si). The first semiconductor chip 300 may have a front surface 300a and a rear surface 300b. Hereinafter, in this specification, the front surface may be defined as one surface of an active surface side of an integrated element in the semiconductor chip, e.g., a surface on which the pads of the semiconductor chip are disposed, and the rear surface may be defined as a surface that is opposite to the front surface. For example, the first semiconductor chip 300 may include the first chip pads 320 disposed on the front surface 300a of the first semiconductor chip 300, a first lower protective layer 330 covering the front surface 300a of the first semiconductor chip 300, and a first additional protective layer 340 covering a bottom surface of the first lower protective layer 330, which are sequentially disposed from the first base layer 310.

The first chip pads 320 may be electrically connected to an integrated device or integrated circuits in the first semiconductor chip 300. According to embodiments, lines for the redistribution may be provided between the first chip pads 320 and the integrated device in the first semiconductor chip 300. The first chip pads 320 may have a width of about 1 μm to about 10 μm. An interval between each of the first chip pads 320 may be 1 μm to 10 μm. The first chip pads 320 may include a conductive material such as a metal. For example, the first chip pads 320 may include copper (Cu).

The first chip pads 320 may include first seed layers 322 disposed between the first chip pads 320 and the first base layer 310. The first seed layers 322 may cover top surfaces of the first chip pads 320. In addition, the first seed layers 322 may extend onto side surfaces of the first chip pads 320. For example, the first seed layers 322 may be interposed between the first chip pads 320 and a first lower protective layer 330, which will be described later. Side surfaces of the first seed layers 322 may be coplanar with side surfaces of the first chip pads 320. Each of the first seed layers 322 may have a thickness of about 5 Å to about 50 Å. Each of the first seed layers 322 may include titanium (Ti), copper (Cu), ruthenium (Ru), nickel (Ni), tungsten (W), and/or gold (Au).

The first lower protective layer 330 may at least partially surround the first chip pads 320 on the front surface 300a of the first semiconductor chip 300. For example, the first lower protective layer 330 may cover the bottom surface of the first base layer 310 (e.g., the front surface 300a of the semiconductor chip 300) to contact the side surfaces of the first chip pads 320. The lowermost end of the first lower protective layer 330 may be located at the same level as each of the bottom surfaces of the first chip pads 320 or located at a level lower than that of each of the bottom surfaces of the first chip pads 320. The first lower protective layer 330 may have a thickness of about 5 μm to about 10 μm. The first lower protective layer 330 may include an insulation material having a high Young's modulus. For example, a Young's modulus of the first lower protective layer 330 may be about 30 GPa to about 50 GPa. Accordingly, the integrated circuit or the like in the first semiconductor chip 300 may be firmly protected. The first lower protective layer 330 may include an oxide or a nitride. For example, the first lower protective layer 330 may include silicon oxide (SiO), silicon nitride (SiN), and/or silicon carbonitride (SiCN).

The first lower protective layer 330 may include a first recess RS1 defined in a bottom surface thereof. The first recess RS1 may face the first base layer 310 from the bottom surface of the first lower protective layer 330. For example, as illustrated in FIGS. 1A and 2A, the first recess RS1 may have a concave shape (e.g., a shape that is rounded upward) toward the first base layer 310. For example, as the first recess RS1 approaches the first chip pads 320, a depth thereof may decrease. Alternatively, when a distance between the first chip pads 320 is large, the depth of the first recess RS1 may be constant in a central area of the first recess RS1. As approaching the first chip pads 320 in an area adjacent to the first chip pads 320, the depth of the first recess RS1 may decrease. The first recess RS1 may have one end that contacts the side surfaces of the first chip pads 320. For example, the first recess RS1 may be defined over an entire area of the exposed bottom surface of the first lower protective layer 330. The first recess RS1 may have a depth t2 corresponding to about ½ to about 1/10 of a thickness t1 of the first lower protective layer 330. Here, the thickness t1 of the first lower protective layer 330 may be a thickness from the top surface of the first lower protective layer 330 to the lowest end of the first lower protective layer 330. For example, the depth t2 of the first recess RS1 may be about 1 μm to about 2 μm. The lowermost end of the first lower protective layer 330 may be located at the same level as each of the bottom surfaces of the first chip pads 320 or located at a level lower than that of each of the bottom surfaces of the first chip pads 320 according to the depth T2 of the first recess RS1. For example, as illustrated in FIG. 2A, the side surfaces of the first chip pads 320 may be covered by the first lower protective layer 330. Alternatively, as illustrated in FIG. 2B, some of the side surfaces of the first chip pads 320 may be exposed from the first lower protective layer 330. For example, lower portions of the side surfaces of the first chip pads 320 may be exposed.

Alternatively, the first recess RS1 may have a trapezoidal-shaped cross-section. For example, as illustrated in FIG. 2C, the first recess RS1 has a bottom surface BS parallel to the top surface of the first lower protective layer 330 and also an inclined surface DS surrounding the bottom surface BS in view of the plane. The inclined surface DS may be inclined toward the interposer substrate 200 from the bottom surface BS toward the first chip pads 320. The inclined surface DS may be a plane having a constant inclination with respect to the bottom surface BS. Alternatively, as described in a case in which the distance between the first chip pads 320 is far in the embodiment of FIG. 2A, the inclined surface DS may be a curved surface. The following description will continue with reference to the embodiment of FIG. 2A.

The first additional protective layer 340 may be disposed on the bottom surface of the first lower protective layer 330. The first additional protective layer 340 may cover the bottom surface of the first lower protective layer 330. The first additional protective layer 340 may fill the first recess RS1 of the first lower protective layer 330. The top surface of the first additional protective layer 340 may have a convex shape (e.g., a shape that is rounded upward) toward the first base layer 310. The bottom surface of the first additional protective layer 340 may be disposed at the same level as each of the bottom surfaces of the first chip pads 320. The bottom surface of the first additional protective layer 340 may be a substantially flat and coplanar with the bottom surfaces of the first chip pads 320. One end of the first additional protective layer 340 may contact the side surfaces of the first chip pads 320. In this case, as illustrated in FIG. 2A, one end of the first additional protective layer 340 may contact an edge (e.g., a contact point between the top surface and the side surface of each of the first chip pads). Alternatively, as illustrated in FIG. 2B, the first additional protective layer 340 may cover the lower portions of the side surfaces of the first chip pads 320. The thickness t2 of the first additional protective layer 340 (which may be the same as the depth of the first recess RS1, and hereinafter, the same reference numerals are used) may be about ½ to about 1/10 of the thickness t1 of the first lower protective layer 330. For example, the thickness t2 of the first additional protective layer 340 may be about 1 μm to about 2 μm. Here, the thickness 2 of the first additional protective layer 340 may be a thickness from the bottom surface of the first additional protective layer 340 to the uppermost end of the first additional protective layer 340. According to embodiments, as illustrated in FIG. 2C, the first additional protective layer 340 may have a trapezoidal-shaped cross-section. The first additional protective layer 340 may at least partially overlap the first lower protective layer 330 in a view of the plane. For example, the first additional protective layer 340 may cover the entire bottom surface of the first lower protective layer 330. For this reason, as illustrated in FIG. 3, the first lower protective layer 330 might not be exposed on the front surface 300a of the first semiconductor chip 300. The first additional protective layer 340 may have a Young's modulus that is less than that of the first lower protective layer 330. For example, the Young's modulus of the first additional protective layer 340 may be greater about 0.1 times to about 0.5 times that of the Young's modulus of the first lower protective layer 330. The Young's modulus of the first additional protective layer 340 may be about 1 GPa to about 10 GPa. The first additional protective layer 340 may include a material having higher elasticity and/or ductility than the first lower protective layer 330. Alternatively, the first additional protective layer 340 may include an adhesive material. The first additional protective layer 340 may include a polymer. For example, the polymer may include a PMMA, a resin, or the like.

The first semiconductor chip 300 may further include a first upper protective layer 350. The first upper protective layer 350 may be disposed on the rear surface 300b of the first semiconductor chip 300. The first upper protective layer 350 may cover the top surface of the first base layer 310. The first upper protective layer 350 may have a thickness of about 1 μm to about 2 μm. The first upper protective layer 350 may include a material having higher elasticity and/or ductility than the first lower protective layer 330. The first upper protective layer 350 may include the same material as the first lower protective layer 330. For example, the first upper protective layer 350 may include a polymer. According to embodiments, the first upper protective layer 350 may include the same material as the first lower protective layer 330. For example, the first upper protective layer 350 may include an insulation material having a high Young's modulus (e.g., silicon oxide, silicon nitride, or silicon carbonitride).

The thickness of the first semiconductor chip 300, which is defined as a distance from the bottom surface of the first additional protective layer 340 to the top surface of the first upper protective layer 350, may be about 30 μm to about 50 μm.

The first semiconductor chip 300 may further include a first conductive pattern exposed on the top surface of the first upper protective layer 350. For example, the first conductive pattern may be first through electrodes 360. The first through electrodes 360 may vertically pass through the first base layer 310 and the first upper protective layer 350. The first through electrodes 360 may extend up to the top surface of the first upper protective layer 350 and ends of the first through electrodes 360 may be exposed on the top surface of the first upper protective layer 350. In this case, top surfaces of the first through electrodes 360 may be coplanar with the top surface of the first upper protective layer 350, and the top surfaces of the first through electrodes 360 and the top surface of the first upper protective layer 350 may be substantially flat. The other ends of the first through electrodes 360 may extend toward the front surface 300a of the first semiconductor chip 300 and may be connected to the first chip pads 320. A width of each of the first through electrodes 360 may be less than that of each of the first chip pads 320.

The first semiconductor chip 300 may be mounted on the interposer substrate 200. As illustrated in FIG. 1A, the front surface 300a of the first semiconductor chip 300 may face the interposer substrate 200, and the first semiconductor chip 300 may be electrically connected to the interposer substrate 200. In this case, the front surface 300a of the first semiconductor chip 300, e.g., the bottom surface of the first additional protective layer 340, may contact the top surface of the interposer substrate 200. For example, the first chip pads 320 of the first semiconductor chip 300 may contact the first substrate pads 220 of the interposer substrate 200, and the first additional protective layer 340 may contact the base layer 210 of the interposer substrate 200.

The second semiconductor chip 400 may be mounted on the first semiconductor chip 300. The second semiconductor chip 400 may be substantially equal or similar to the first semiconductor chip 300. In FIG. 1A, a width of the second semiconductor chip 400 is illustrated as being the same as the width of the first semiconductor chip 300, but the inventive concept is not necessarily limited thereto. The width of the second semiconductor chip 400 may be less or greater than that of the first semiconductor chip 300. The second semiconductor chip 400 may have a front surface 400a and a rear surface 400b. The second semiconductor chip 400 may include a second chip pads 420 disposed on the front surface 400a of the second semiconductor chip 400, a second lower protective layer 430 covering the front surface 400a of the second semiconductor chip 400, and a second additional protective layer 440 covering a bottom surface of the second lower protective layer 430, which are sequentially disposed on the second base layer 410.

The second chip pads 420 may be electrically connected to an integrated device or integrated circuits in the second semiconductor chip 400. The second chip pads 420 may have a width of about 2 μm to about 10 μm. An interval between the second chip pads 420 may be 2 μm to 10 μm.

The second chip pads 420 may include second seed layers 422 disposed between the second chip pads 420 and the second base layer 410. The second seed layers 422 may cover top surfaces of the second chip pads 420. In addition, the second seed layers 422 may extend onto the side surfaces of the second chip pads 420. The side surfaces of the second seed layers 422 may be coplanar with the side surfaces of the second chip pads 420.

The second lower protective layer 430 may at least partially surround the second chip pads 420 on the front surface 400a of the second semiconductor chip 400. For example, the second lower protective layer 430 may cover a bottom surface of the second base layer 410 and may contact side surfaces of the second chip pads 420. The second lower protective layer 430 may include an oxide or a nitride. The second lower protective layer 430 may include a second recess RS2 defined in a bottom surface thereof. The second recess RS2 may have a shape that is concave from the bottom surface of the second lower protective layer 430 toward the second base layer 410. The second recess RS2 may have one end that contacts the side surfaces of the second chip pads 420. The second recess RS2 may have a depth corresponding to about ½ to about 1/10 of the thickness of the second lower protective layer 430.

The second additional protective layer 440 may cover the bottom surface of the second lower protective layer 430. The second additional protective layer 440 may fill the second recess RS2 of the second lower protective layer 430. The top surface of the second additional protective layer 440 may have a shape that is convex toward the second base layer 410. The bottom surface of the second additional protective layer 440 may be coplanar with the bottom surfaces of the second chip pads 420. One end of the second additional protective layer 440 may contact the side surfaces of the second chip pads 420. Here, the one end of the second additional protective layer 440 may contact an edge of the second chip pads 420 or may cover lower portions of the side surfaces of the second chip pads 420. The second additional protective layer 440 may have a thickness corresponding to about ½ to about 1/10 of the thickness of the second lower protective layer 430. The second additional protective layer 440 may cover the entire bottom surface of the second lower protective layer 430, and the second lower protective layer 430 might not be exposed on the front surface 400a of the second semiconductor chip 400 by the second additional protective layer 440. The second additional protective layer 440 may include a material having higher elasticity and/or ductility than the second lower protective layer 430. Alternatively, the second additional protective layer 440 may include an adhesive material. The second additional protective layer 440 may include a polymer. For example, the polymer may include PMMA, resin, or the like.

The second semiconductor chip 400 may further include a second upper protective layer 450. The second upper protective layer 450 may cover the back surface 400b of the second semiconductor chip 400. The second upper protective layer 450 may include a material having higher elasticity and/or ductility than the second lower protective layer 430. For example, the second upper protective layer 450 may include a polymer. According to embodiments, the second upper protective layer 450 may include an insulation material having a high Young's modulus (e.g., silicon oxide or silicon nitride).

The second semiconductor chip 400 may further include a second conductive pattern exposed on the top surface of the second upper protective layer 450. For example, the second conductive pattern may be second through electrodes 460 vertically passing through the second base layer 410 and the second upper protective layer 450. First ends of the second through electrodes 460 may be exposed to the top surface of the second upper protective layer 450. Here, the top surfaces of the second through electrodes 460 may be substantially flat and coplanar with the top surface of the second upper protective layer 450. The other ends of the second through electrodes 460 may extend toward the front surface 400a of the second semiconductor chip 400 so as to be connected to the second chip pads 420.

The second semiconductor chip 400 may be mounted on the first semiconductor chip 300. As illustrated in FIGS. 1A and 2A, the front surface 400a of the second semiconductor chip 400 may face the first semiconductor chip 300. Here, the front surface 400a of the second semiconductor chip 400 may contact the rear surface 300b of the first semiconductor chip 300. For example, the bottom surface of the second additional protective layer 440 may contact the top surface of the first upper protective layer 350. According to the inventive concept, each of the second additional protective layer 440 and the first upper protective layer 350, which contact each other, may include a material having high elasticity and/or ductility. Accordingly, even though impurities such as particles are introduced between the second additional protective layer 440 and the first upper protective layer 350, the first semiconductor chip 300 and the second semiconductor chip 400 may be firmly bonded to each other. In addition, since the second additional protective layer 440 and the first upper protective layer 350, which contact with each other, are made of a highly adhesive material (e.g., a polymer), the first semiconductor chip 300 and the second semiconductor chip 400 may be firmly bonded to each other. For example, structural stability of the semiconductor package may be increased. This will be described in detail together with a method for manufacturing the semiconductor package.

Referring to FIGS. 1A and 2A, a second semiconductor chip 400 may be bonded onto a first semiconductor chip 300. For example, second chip pads 420 of the second semiconductor chip 400 may contact first through electrodes 360 of the first semiconductor chip 300 on a boundary between the first semiconductor chip 300 and the second semiconductor chip 400. In this case, the second chip pads 420 and the first through electrodes 360 may form hybrid bonding between metals. In this specification, "hybrid bonding" means bonding in which two constituents including homogeneous materials are fused at an interface therebetween. For example, the second chip pads 420 and the first through electrodes 360 may have a continuous configuration, and an interface IF between the second chip pads 420 and the first through electrodes 360 might not be visible. For example, the second chip pads 420 and the first through electrodes 360 are made of the same material so that there is no interface between the second chip pads 420 and the first through electrodes 360. For example, the second chip pads 420 and the first through electrodes 360 may be provided as one component. The second semiconductor chip 400 and the first semiconductor chip 300 may be electrically connected to each other through the second chip pads 420 and the first through electrodes 360. Each of the first through electrodes 360 may have a width less than that of each of the second chip pads 420. Accordingly, bottom surfaces of the second chip pads 420 may be exposed on the interface between the second chip pads 420 and the first through electrodes 360. The exposed bottom surfaces of the second chip pads 420 may contact a first upper protective layer 350 of the first semiconductor chip 300.

Although one second semiconductor chip 400 is provided in one chip stack CS in FIG. 1A, the inventive concept is not necessarily limited thereto. The second semiconductor chip 400 may be provided in plural. In this case, the second semiconductor chips 400 may be stacked in a direction perpendicular to an interposer substrate 200. Here, the second semiconductor chips 400 may be vertically bonded to each other in the same manner as described in the bonding between the first semiconductor chip 300 and the second semiconductor chip 400. For example, the second semiconductor chips 400 may perform intermetallic hybrid bonding with the other of the second semiconductor chips 400, which is disposed thereon.

A third semiconductor chip 500 may be mounted on the second semiconductor chip 400. The third semiconductor chip 500 may be substantially equal or similar to the first semiconductor chip 300 and the second semiconductor chip 400. The third semiconductor chip 500 may have a front surface 500a and a rear surface 500b. The third semiconductor chip 500 may include a third chip pads 520 disposed on the front surface 500a of the third semiconductor chip 500, a third lower protective layer 530 covering the front surface 500a of the third semiconductor chip 500, and a third additional protective layer 540 covering a bottom surface of the third lower protective layer 530, which are sequentially disposed from the third base layer 510.

The third chip pads 520 may be electrically connected to an integrated device or integrated circuits in the third semiconductor chip 500. The third chip pads 520 may include third seed layers 522 disposed between the third chip pads 520 and the third base layer 510. The third seed layers 522 may cover side and top surfaces of the third chip pads 520.

The third lower protective layer 530 may at least partially surround the third chip pads 520 on the front surface 500a of the third semiconductor chip 500. For example, the third lower protective layer 530 may cover a bottom surface of the third base layer 510 and may contact side surfaces of the third chip pads 520. The third lower protective layer 530 may include an oxide or a nitride.

The third additional protective layer 540 may cover the bottom surface of the third lower protective layer 530. The third additional protective layer 540 may fill a third recess RS3 formed in the bottom surface of the third lower protective layer 530. A top surface of the third additional protective layer 530 may have a shape that is convex toward the third base layer 510. A bottom surface of the third additional protective layer 540 may be substantially flat and coplanar with the bottom surfaces of the third chip pads 520. One end of the third additional protective layer 540 may contact side surfaces of the third chip pads 520. The third additional protective layer 540 may have a thickness corresponding to about ½ to about 1/10 of a thickness of the third lower protective layer 530. The third additional protective layer 540 may include a material having higher elasticity and/or ductility than the third lower protective layer 530. Alternatively, the third additional protective layer 540 may include an adhesive material. For example, the third additional protective layer 540 may include a polymer. For example, the polymer may include a PMMA, a resin, or the like.

The third semiconductor chip 500 may further include a third upper protective layer 550. The third upper protective layer 550 may cover the rear surface 500b of the third semiconductor chip 500. The third upper protective layer 550 may include an insulation material such as an oxide or a nitride (e.g., silicon oxide or silicon nitride) or a polymer. The third upper protective layer 550 may be omitted as necessary.

The third semiconductor chip 500 may be mounted on the second semiconductor chip 400. The front surface 500a of the third semiconductor chip 500 may face the second semiconductor chip 400. Here, the front surface 500a of the third semiconductor chip 500 may contact the rear surface 400b of the second semiconductor chip 400. For example, a bottom surface of the third additional protective layer 540 may contact the top surface of the second upper protective layer 450.

The third semiconductor chip 500 may be bonded on the second semiconductor chip 400. Like the description of the bonding between the first semiconductor chip 300 and the second semiconductor chip 400 as described above, the third semiconductor chip 500 may perform intermetallic hybrid bonding with the second semiconductor chip 400 on a boundary between the third semiconductor chip 500 and the second semiconductor chip 400. The third semiconductor chip 500 and the second semiconductor chip 400 may be electrically connected to each other through the third chip pads 520 and the second through electrodes 460.

A molding layer 600 may be provided on an interposer substrate 200. The molding layer 600 may cover a top surface of the interposer substrate 200. The molding layer 600 may at least partially surround a chip stack CS. For example, the molding layer 600 may cover the side surface of the first semiconductor chip 300, the side surface of the second semiconductor chip 400, and the side surface of the third semiconductor chip 500. The molding layer 600 may protect the chip stack CS. The molding layer 600 may include an insulation material. For example, the molding layer 600 may include an epoxy molding compound (EMC). Unlike the illustrated example, the molding layer 600 may cover the chip stack CS. For example, the molding layer 600 may cover the rear surface 500*b* of the third semiconductor chip 500.

Although the semiconductor chips 300, 400, and 500 are mounted on the interposer substrate 200 in FIG. 1A, the inventive concept is not necessarily limited thereto. According to embodiments, the semiconductor chips 300, 400, and 500 may be mounted on a base semiconductor chip 200'. As illustrated in FIG. 1B, the base semiconductor chip 200' may be a wafer level semiconductor substrate made of a silicon semiconductor. The base semiconductor chip 200' may include an integrated circuit. For example, the integrated circuit may be a memory circuit, a logic circuit, or a combination thereof. The integrated circuit may be electrically connected to first base chip pads 220' provided on a top surface of the base semiconductor chip 200'. The integrated circuit may be electrically connected to second base chip pads 230' provided on a bottom surface of the base semiconductor chip 200' through base through electrodes 240' that is connected to the first base chip pads 220' to vertically pass through the base semiconductor chip 200'. Base seed layers 222' may be interposed between the first base chip pads 220' and the base semiconductor chip 200'. The base seed layers 222' may cover bottom and side surfaces of the first base chip pads 220'.

The base semiconductor chip 200' may include a first base protective layer 260', which protects the first base chip pads 220' and the integrated circuit, on atop surface thereof. The first base protective layer 260' may cover the top surface of the base semiconductor chip 200' and may at least partially surround the first base chip pads 220'. A first base protective layer 260' may include an insulation material having a high Young's modulus. Accordingly, the integrated circuit and the like in the base semiconductor chip 200' may be firmly protected. The first base protective layer 260' may include an oxide or a nitride. The first base protective layer 260' may include a recess formed in a bottom surface thereof. The recess may be formed to face the base semiconductor chip 200' from a top surface of the first base protective layer 260'. The recess may be formed over an entire area of the exposed top surface of the first base protective layer 260'.

A second base protective layer 270' may be disposed on the top surface of the first base protective layer 260'. The second base protective layer 270' may cover the top surface of the first base protective layer 260'. The second base protective layer 270' may fill the recess of the first base protective layer 260'. A top surface of the second base protective layer 270' may be coplanar with the top surfaces of the first base chip pads 220'. The second base protective layer 270' may cover an entire bottom surface of the first base protective layer 260'. Thus, the first base protective layer 260' might not be exposed on the top surface of the base semiconductor chip 200'. A Young's modulus of the second base protective layer 270' may be less than that of the first base protective layer 260'. For example, the second base protective layer 270' may include a polymer.

The first semiconductor chip 300 may be mounted on the base semiconductor chip 200'. As illustrated in FIG. 1B, the front surface 300*a* of the first semiconductor chip 300 may face the base semiconductor chip 200'. For example, the bottom surface of the first additional protective layer 340 may contact the top surface of the second base protective layer 270'. According to the inventive concept, the first additional protective layer 340 and the second base protective layer 270', which contact each other, may include a material having high elasticity and/or ductility. Accordingly, even when impurities such as particles are introduced between the first additional protective layer 340 and the second base protective layer 270', the base semiconductor chip 200' and the first semiconductor chip 300 may be firmly bonded to each other.

In the embodiments of FIGS. 1A, 2, and 3, the conductive patterns provided on the rear surfaces of the semiconductor chips 300 and 400 are the through electrodes 360 and 460, but the inventive concept is not necessarily limited thereto.

Figure 4:
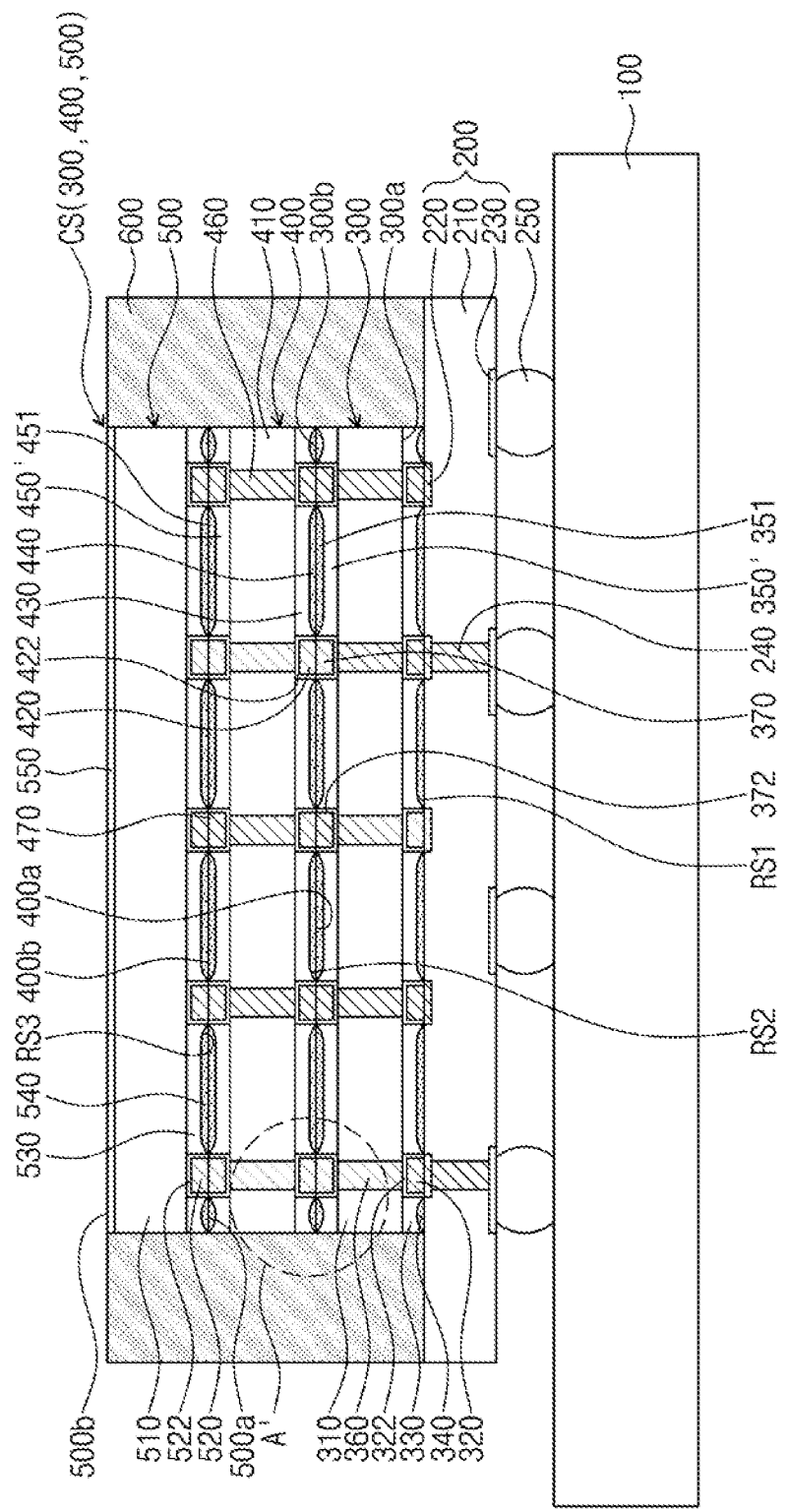
FIG. 4 is a cross-sectional view illustrating a semiconductor package according to embodiments of the inventive concept.
Figure 5:
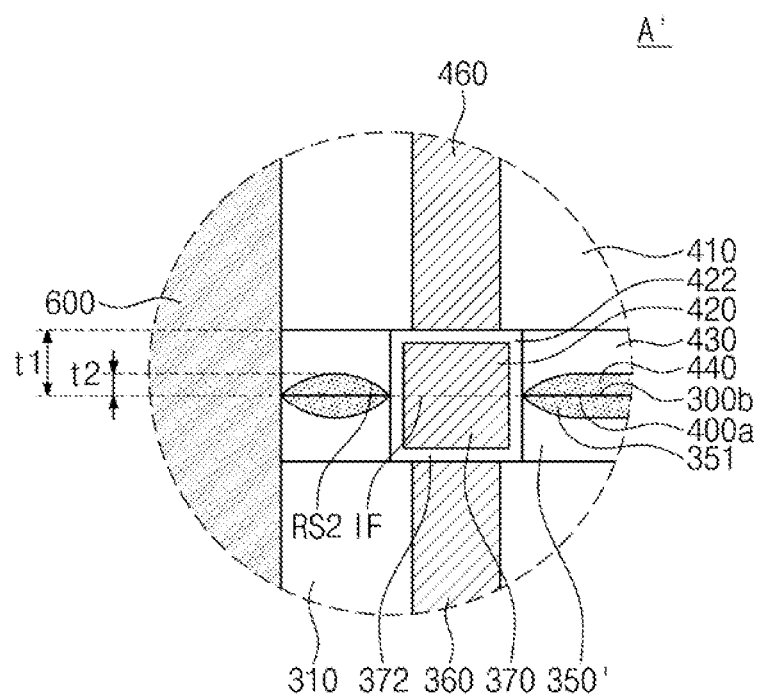
FIG. 5 is a partial enlarged view of FIG. 4.

FIG. 4 is a cross-sectional view illustrating the semiconductor package according to embodiments of the inventive concept. FIG. 5 is a partial enlarged view of FIG. 4, e.g., an enlarged view of an area A' of FIG. 4. For convenience of explanation, differences from the description with reference to FIGS. 1A, 2 and 3 will be described.

Referring to FIGS. 4 and 5, the first semiconductor chip 300 may first chip pads 320 disposed on the front surface 300*a* of the first semiconductor chip 300, first lower protective layer 330 covering the front surface 300*a* of the first semiconductor chip 300, a first additional protective layer 340 covering a bottom surface of the first lower protective layer 330, a first upper protective layer 350' covering the rear surface 300*b* of the first semiconductor chip 300, and a first upper additional protective layer 351 on the first upper protective layer 350', which are sequentially disposed from the first base layer 310.

The first semiconductor chip 300 may include a first conductive pattern exposed on the top surface of the first upper protective layer 350'. For example, the first conductive pattern may be first rear pads 370. The first rear pads 370 may be disposed on the top surface of the first base layer 310. The first rear pads 370 may be at least partially surrounded by the first upper protective layer 350' and exposed on the top surface of the first upper protective layer 350'. The first rear pads 370 may include a fourth seed layer 372 disposed between the first rear pads 370 and the first base layer 310. The fourth seed layer 372 may cover the bottom and side surfaces of the first rear pads 370.

The first through electrodes 360 of the first semiconductor chip 300 may vertically pass through the first base layer 310. One ends of the first through electrodes 360 may extend toward the rear surface 300*b* of the first semiconductor chip 300 and be connected to the first rear pads 370, and the other ends may extend toward the front surface 300a of the first semiconductor chip 300 and be connected to the first chip pads 320.

The first upper protective layer 350' may cover the rear surface 300b of the first semiconductor chip 300 and at least partially surround the first rear pads 370. The first upper protective layer 350' may include an insulation material having a high Young's modulus. The first upper protective layer 350' may include an oxide or a nitride. The first upper protective layer 350' may include a recess formed in atop surface thereof. The recess may be formed to face the first base layer 310 from the top surface of the first upper protective layer 350'. The recess may be formed over an entire area of the exposed top surface of the first upper protective layer 350'.

The first upper additional protective layer 351 may be disposed on the top surface of the first upper protective layer 350'. The first upper additional protective layer 351 may cover the top surface of the first upper protective layer 350'. The first upper additional protective layer 351 may fill the recess of the first upper protective layer 350'. The top surface of the first upper additional protective layer 351 may be coplanar with the top surfaces of the first rear pads 370. The first upper additional protective layer 351 may cover the entire top surface of the first upper protective layer 350. As a result, the first upper protective layer 350' might not be exposed on the rear surface 300b of the first semiconductor chip 300. The Young's modulus of the first upper protective layer 351 may be less than that of the first upper protective layer 350'. For example, the first upper additional protective layer 351 may include a polymer.

The second semiconductor chip 400 may be mounted on the first semiconductor chip 300. The second semiconductor chip 400 may be substantially equal or similar to the first semiconductor chip 300. The second semiconductor chip 400 may second chip pads 420 disposed on the front surface 400a of the second semiconductor chip 400, second lower protective layer 430 covering the front surface 400a of the second semiconductor chip 400, a second additional protective layer 440 covering a bottom surface of the second lower protective layer 430, a second upper protective layer 450' covering the rear surface 400b of the second semiconductor chip 400, and a second upper additional protective layer 451 on the second upper protective layer 450', which are sequentially disposed from the second base layer 410.

The second semiconductor chip 400 may include a second conductive pattern exposed on a top surface of the second upper protective layer 450'. For example, the second conductive pattern may be second rear pads 470. The second rear pads 470 may be disposed on a top surface of the second base layer 410. The second rear pads 470 may be at least partially surrounded by the second upper protective layer 450' and exposed on the top surface of the second upper protective layer 450'. Here, top surfaces of the second rear pads 470 may be substantially flat and coplanar with the top surface of the second upper protective layer 450'.

The second semiconductor chip 400 may further include second through electrodes 460. The second through electrodes 460 may vertically pass through the second base layer 410 so as to be connected to the first rear pads 370 and the first chip pads 320.

The second upper protective layer 450' may cover the rear surface 400b of the second semiconductor chip 400 and at least partially surround the second rear pads 470. The second upper protective layer 450' may include an insulation material having a high Young's modulus. The second upper protective layer 450' may include a recess formed in atop surface thereof. The recess may be formed to face the second base layer 410 from the top surface of the second upper protective layer 450'.

The second upper additional protective layer 451 may be disposed on the top surface of the second upper protective layer 450'. The second upper additional protective layer 451 may fill the recess of the second upper protective layer 450'. The top surface of the second upper additional protective layer 451 may be coplanar with the top surfaces of the second rear pads 470. The second upper additional protective layer 451 may cover an entire top surface of the second upper protective layer 450. The Young's modulus of the second upper additional protective layer 451 may be less than that of the second upper protective layer 450'. For example, the second upper additional protective layer 451 may include a polymer.

The second semiconductor chip 400 may be mounted on the first semiconductor chip 300. As illustrated in FIGS. 4 and 5, the front surface 400a of the second semiconductor chip 400 may face the first semiconductor chip 300. Here, the front surface 400a of the second semiconductor chip 400 may contact the rear surface 300b of the first semiconductor chip 300.

The second semiconductor chip 400 may be mounted on the first semiconductor chip 300. The front surface 400a of the second semiconductor chip 400 may contact the rear surface 300b of the first semiconductor chip 300. For example, the bottom surface of the second additional protective layer 440 may contact the top surface of the first upper additional protective layer 351. According to the inventive concept, each of the second additional protective layer 440 and the first upper additional protective layer 351, which contact each other, may include a material having high elasticity and/or ductility. Accordingly, even though impurities such as particles are introduced between the second additional protective layer 440 and the first upper additional protective layer 351, the first semiconductor chip 300 and the second semiconductor chip 400 may be firmly bonded to each other. In addition, since the second additional protective layer 440 and the first upper additional protective layer 351, which contact with each other, are made of a highly adhesive material (e.g., a polymer), the first semiconductor chip 300 and the second semiconductor chip 400 may be firmly bonded to each other. For example, structural stability of the semiconductor package may be increased.

The second semiconductor chip 400 may be bonded on the first semiconductor chip 300. For example, the second chip pads 420 and the first rear pads 370 may perform intermetallic hybrid bonding therebetween on a boundary between the first semiconductor chip 300 and the second semiconductor chip 400. For example, the second chip pads 420 and the first rear pads 370 may have a continuous configuration, and an interface between the second chip pads 420 and the first rear pads 370. (IF) might not be visible.

A third semiconductor chip 500 may be mounted on the second semiconductor chip 400. The configuration of the three semiconductor chips 500 may be equal or similar to those described herein with reference to FIGS. 1A, 2, and 3.

The third semiconductor chip 500 may be mounted on the second semiconductor chip 400. The front surface 500a of the third semiconductor chip 500 may face the second semiconductor chip 400. A bottom surface of the third additional protective layer 540 may contact a top surface of the second upper additional protective layer 451.

The third semiconductor chip 500 may be bonded on the second semiconductor chip 400. Like the description of the bonding between the first semiconductor chip 300 and the second semiconductor chip 400 as described above, the third semiconductor chip 500 may perform intermetallic hybrid bonding with the second rear pads 470 on a boundary between the third semiconductor chip 500 and the second semiconductor chip 400. The third semiconductor chip 500 and the second semiconductor chip 400 may be electrically connected to each other through the third chip pads 520, the second rear pads 470, and the second through electrodes 460.

Figure 6:
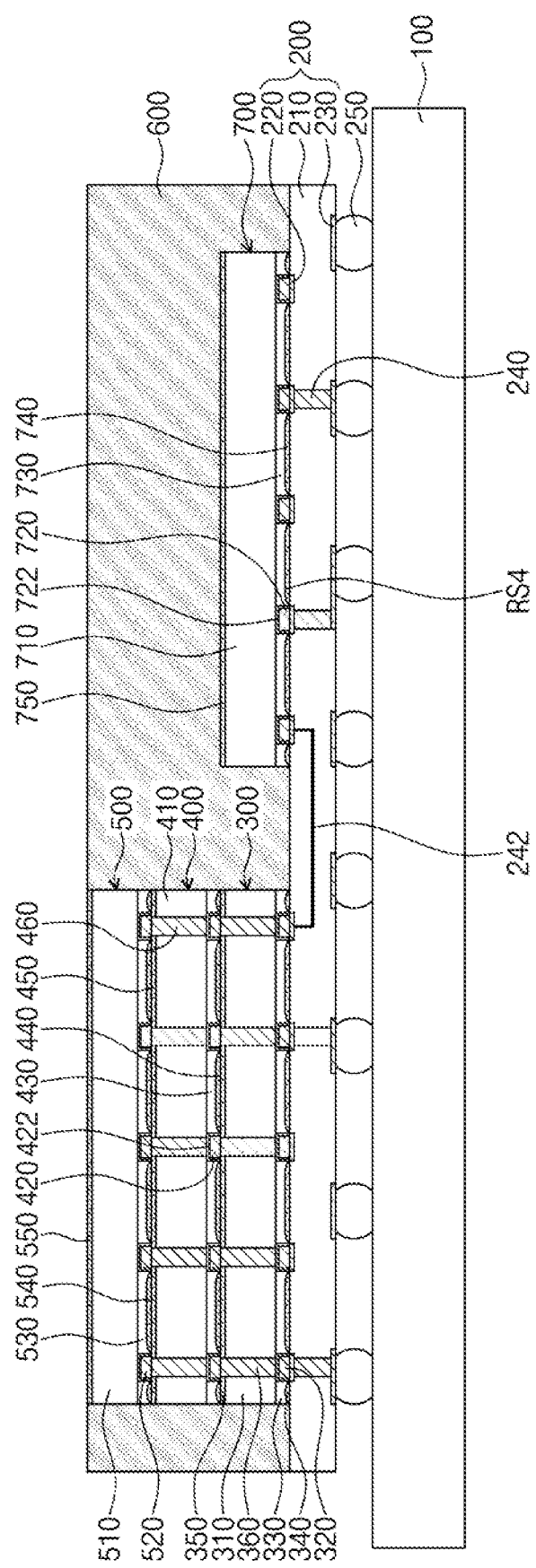
FIG. 6 is a cross-sectional view illustrating a semiconductor package according to embodiment of the inventive concept.

FIG. 6 is a cross-sectional view illustrating the semiconductor package according to embodiment of the inventive concept.

Referring to FIG. 6, a chip stack CS may be provided on an interposer substrate 200. The chip stack CS may include first to third semiconductor chips 300, 400, and 500 stacked on the interposer substrate 200. The first to third semiconductor chips 300, 400, and 500 may be the same as those described herein with reference to FIGS. 1A, 2, and 3.

A fourth semiconductor chip 700 may be provided on the interposer substrate 200. The fourth semiconductor chip 700 may be spaced apart from the chip stack CS in a direction parallel to a top surface of the interposer substrate 200. For example, a spaced distance between the first semiconductor chip 300 and the fourth semiconductor chip 700 of the chip stack CS may be about 50 μm to about 100 μm. The fourth semiconductor chip 700 and the chip stack CS may be electrically connected to each other by a circuit line 242 in a base layer 210 of the interposer substrate 200. The first to third semiconductor chips 300, 400, and 500 of the chip stack CS may be memory chips such as a DRAM, an SRAM, an MRAM, or a flash memory, and the fourth semiconductor chip 700 may be a logic chip.

The fourth semiconductor chip 700 may include a fourth chip pads 720 disposed on the front surface of the fourth semiconductor chip 700, a fourth lower protective layer 730 covering the front surface of the fourth semiconductor chip 700, and a fourth additional protective layer 740 covering a bottom surface of the fourth lower protective layer 730, which are sequentially disposed from the fourth base layer 710. The fourth lower protective layer 730 may at least partially surround the fourth chip pads 720 on the front surface of the fourth semiconductor chip 700. The fourth lower protective layer 730 may include an oxide or a nitride. The fourth additional protective layer 740 may fill a fourth recess RS4 defined in the bottom surface of the fourth lower protective layer 730. A top surface of the fourth additional protective layer 730 may have a shape that is convex toward the fourth base layer 710. The bottom surface of the fourth additional protective layer 740 may be coplanar with the bottom surfaces of the fourth chip pads 720. The fourth additional protective layer 740 may include a material having higher elasticity and/or ductility than the fourth lower protective layer 730. Four seed layers 722 may be provided between the fourth chip pads 720 and the fourth base layer 710. The fourth semiconductor chip 700 may further include a fourth upper protective layer 750. The fourth upper protective layer 750 may cover a rear surface of the fourth semiconductor chip 700.

A molding layer 600 may be provided on an interposer substrate 200. The molding layer 600 may cover a top surface of the interposer substrate 200. The molding layer 600 may at least partially surround the chip stack CS and cover the fourth semiconductor chip 700. The molding layer 600 may include an insulation material.

FIGS. 7 to 16 are views illustrating a method for manufacturing the semiconductor package according to embodiments of the inventive concept.

Figure 7:
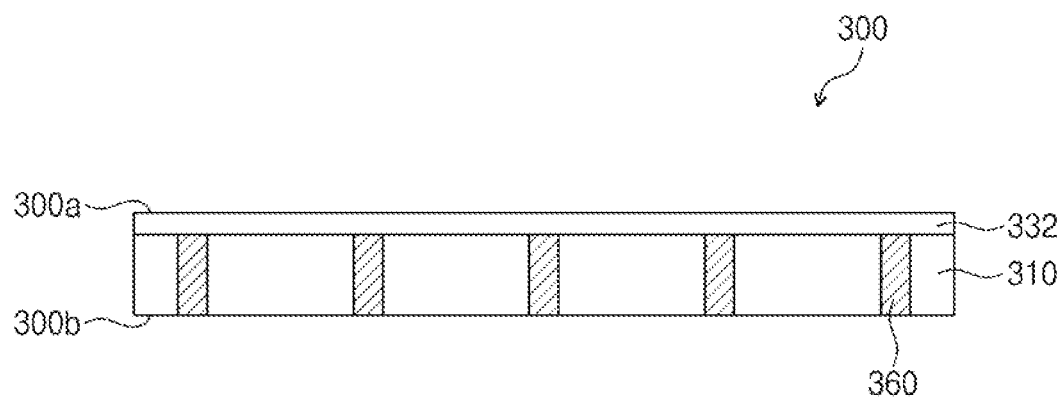
FIGS. 7 to 16 are views illustrating a method for manufacturing a semiconductor package according to embodiments of the inventive concept.

Referring to FIG. 7, a first semiconductor chip 300 may be provided. The first semiconductor chip 300 may include first through electrodes 360 that vertically pass through the first base layer 310 and are exposed on a front surface 300a and a rear surface 300b thereof.

A first preliminary lower protective layer 332 may be formed on the front surface 300a of the first semiconductor chip 300. For example, the first preliminary lower protective layer 332 may be formed by applying a first insulation material on a top surface of the first base layer 310. Here, a thickness of the applied first insulation material may be about 5 μm to about 10 μm. The first insulation material may include silicon oxide (SiO), silicon nitride (SiN), or silicon carbonitride (SiCN). The first preliminary lower protective layer 332 may cover the front surface 300a of the first semiconductor chip 300.

Figure 8:
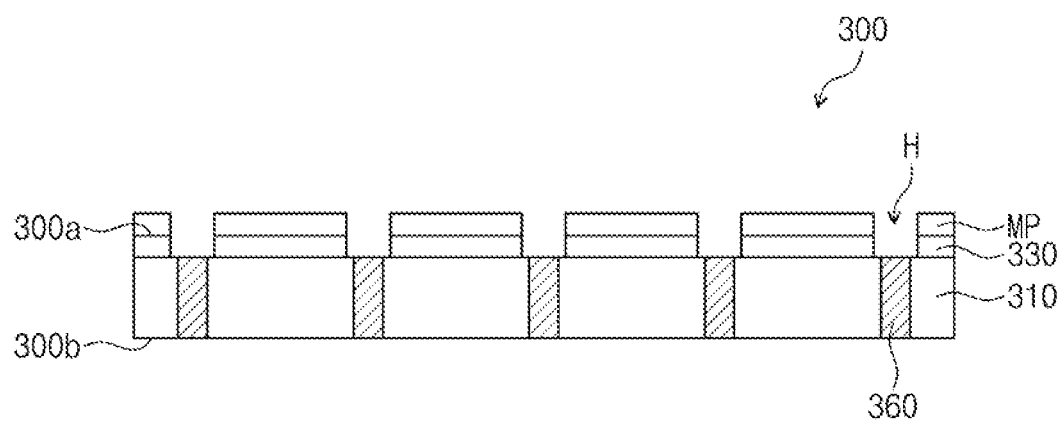

Referring to FIG. 8, a mask pattern MP may be formed on the first preliminary lower protective layer 332. The pattern of the mask pattern MP may least partially overlap the first through electrodes 360.

The first preliminary lower protective layer 332 may be etched using the mask pattern MP as an etch mask to form the first lower protective layer 330. Holes H may be formed in the first lower protective layer 330 by the etching process. The holes H may pass through the first lower protective layer 330 to expose top surfaces of the first through electrodes 360 and a portion of the top surface of the first base layer 310. Each of the holes H may have a width greater than that of each of the first through electrodes 360. The width of each of the holes H may be about 1 μm to about 10 μm. An interval between the holes H may be about 1 μm to about 10 μm. The holes H may define an area on which the first chip pads 320 (see FIG. 9) are formed in a process to be described later.

Figure 9:
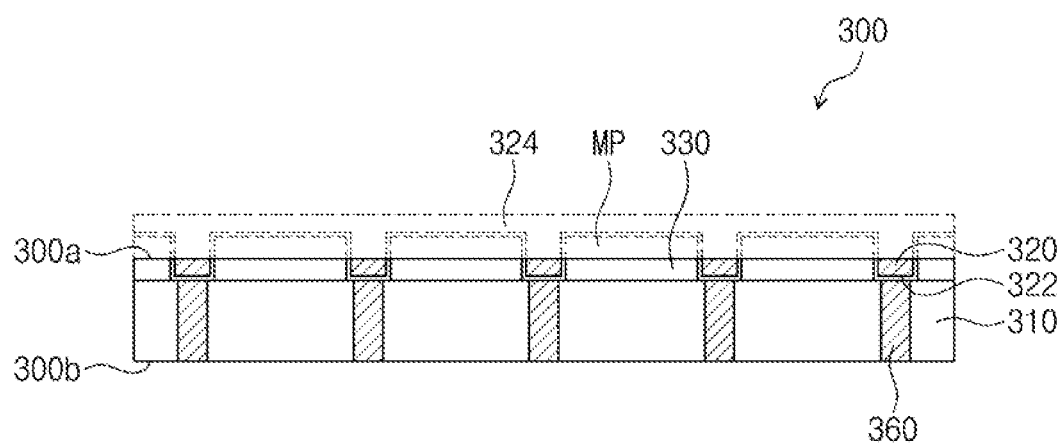

Referring to FIG. 9, a seed layer may be formed in each of the holes H. The seed layer may be formed by depositing a conductive material on the mask pattern MP. The seed layer may conformally cover a top surface of the mask pattern MP, inner surfaces of the holes H, and bottom surfaces of the holes H. Here, a thickness of the conductive material may be about 5 Å to about 50 Å. The conductive material may include titanium (Ti), copper (Cu), ruthenium (Ru), nickel (Ni), tungsten (W), and/or gold (Au).

The conductive layer 324 may be formed on the first lower protective layer 330. For example, the conductive material may be filled in the holes H through a plating process. The conductive material may fill the holes H and cover the seed layer. Alternatively, the conductive layer 324 may be formed by depositing a conductive material on the first lower protective layer 330. In this case, the seed layer might not be necessary.

Thereafter, a portion of the conductive layer 324 and a portion of the seed layer, which are disposed on the top surface of the first lower protective layer 330, may be removed to form the first chip pads 320 and the first seed layers 322. For example, as illustrated by a dotted line, a grinding process may be performed on the top surface of the conductive layer 324. The grinding process may be performed until the top surface of the first lower protective layer 330 is exposed. Other portions of the conductive layer 334 positioned in the holes H may be separated by the grinding process to form first chip pads 320. Other portions of the seed layer positioned in the holes H may be separated by the grinding process to form first seed layers 322. Here, the mask pattern MP may be removed together by the grinding process.

According to embodiments of the inventive concept, the first lower protective layer 330 may be formed using an oxide or a nitride having a high Young's modulus, and thus the first semiconductor chip 300 may be firmly protected. Also, the first chip pads 320 may be formed by filling the holes H formed by patterning the first lower protective layer 330 to form a first chip pad having a small width or a small interval. Thus, the first chip pads 320 having the small width or the small interval may be easily formed. Accordingly, high integration of the semiconductor package may be achieved and the semiconductor package may be miniaturized.

Figure 10:
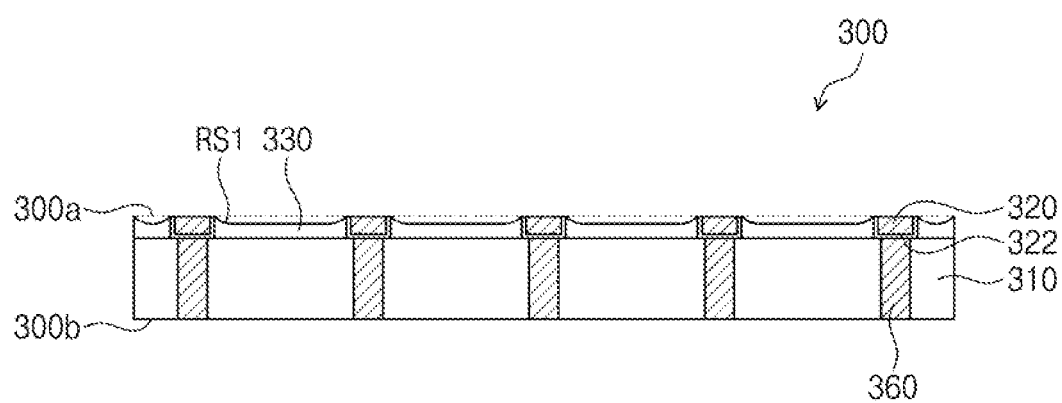

Referring to FIG. 10, some of the first lower protective layers 330 may be removed. For example, an etching process may be performed on the exposed top surface of the first lower protective layer 330 to form a first recess RS1 in the first lower protective layer 330. The etching process may be performed on an entire top surface of the first lower protective layer 330. Here, the first chip pads 320 might not be etched. The etching process may include wet etching or dry etching. A depth by which the first lower protective layer 330 is etched by the etching process may be about 1 μm to about 2 μm. Here, due to process dispersion or error of the etching process, the depth by which the first lower protective layer 330 is removed in an area that is adjacent to the first chip pads 320, e.g., a depth of the first recess RS1 may decrease. In particular, an etching depth of the first lower protective layer 330 may decrease toward the first chip pads 320. Therefore, a side surface of the first recess RS1 may be formed to be inclined with respect to a bottom surface of the first recess RS1 and side surfaces of the first chip pads 320. Here, the side surface of the first recess RS1 may be curved or flat.

Figure 11:
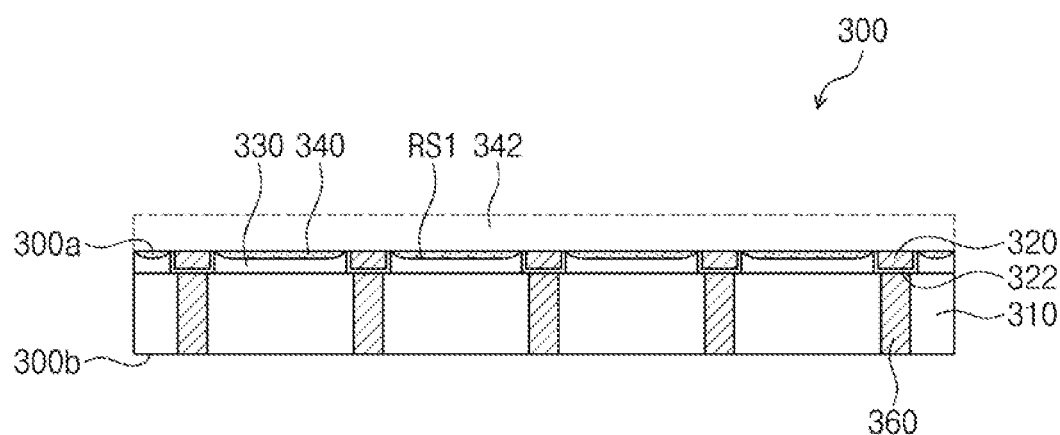

Referring to FIG. 11, a first additional protective layer 340 may be formed on the front surface 300a of the first semiconductor chip 300. For example, a second insulation material 342 may be applied on a top surface of the first base layer 310. The second insulation material 342 may fill the first recess RS1 of the first lower protective layer 330. Also, the second insulation material 342 may cover the first lower protective layer 330 and the first chip pads 320. Thereafter, a portion of the second insulation material 342 may be removed to form the first additional protective layer 340. For example, as illustrated by a dotted line, a grinding process may be performed on the top surface of the second insulation material 342. The grinding process may be performed until the top surfaces of the first chip pads 320 are exposed. A portion of the second insulation material 342 filling the first recess RS1 may form the first additional protective layer 340. After the grinding process, the top surface of the first additional protective layer 340 and the top surfaces of the first chip pads 320 may be substantially flat. The second insulation material 342 may include a material having a Young's modulus less than that of the first insulation material. The second insulation material 342 may include a material that is more elastic or softer than the first insulation material. Alternatively, the second insulation material 342 may include an adhesive material. The first additional protective layer 340 may include a polymer. For example, the polymer may include a PMMA, a resin, or the like.

Figure 12:
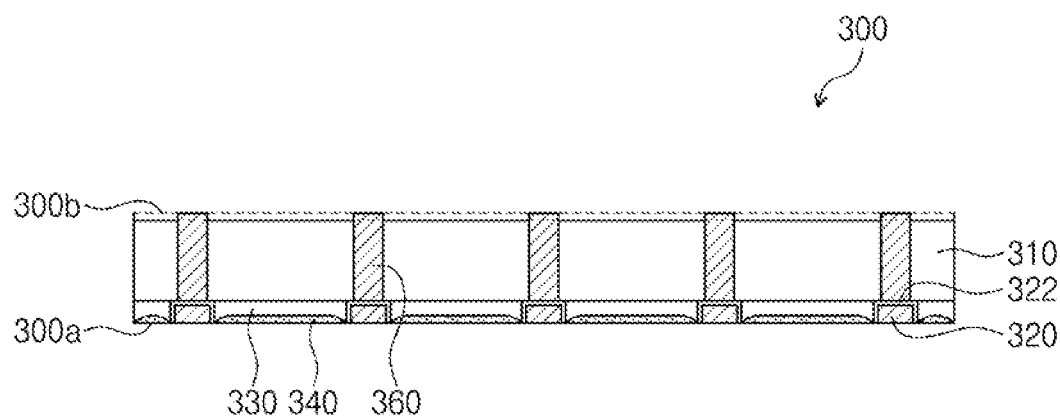

Referring to FIG. 12, after the first semiconductor chip 300 is inverted, a portion of the first base layer 310 may be removed. For example, an etching process may be performed on the rear surface 300b of the first semiconductor chip 300. The etching process may be performed on an entire top surface of the first base layer 310. A depth by which the top surface of the first base layer 310 is etched by the etching process may be about 1 μm to about 2 μm. Here, the first through electrodes 360 might not be etched. For example, the top surface of the first base layer 310 may be formed to face the inside of the first base layer 310 from a top surface of a first through electrodes 360 by the etching process, and the first through electrodes 360 may protrude from a rear surface 300b of the first semiconductor chip 300.

Figure 13:
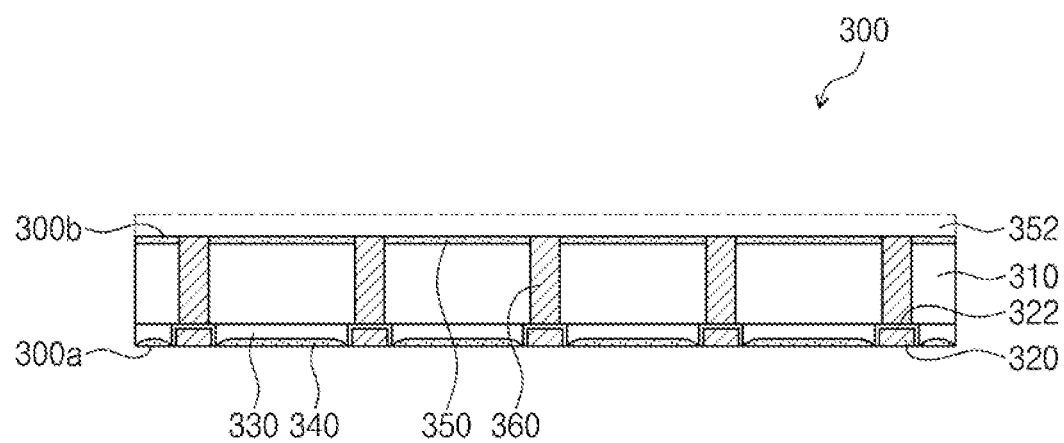

Referring to FIG. 13, a first upper protective layer 350 may be formed on the first semiconductor chip 300. For example, a third insulation material 352 may be applied or deposited on the rear surface 300b of the first semiconductor chip 300. The third insulation material 352 may cover the top surface of the first base layer 310 and the first through electrodes 360 protruding onto the top surface of the first base layer 310. Thereafter, a portion of the third insulation material 352 may be removed to form the first upper protective layer 350. For example, as illustrated by a dotted line, a grinding process may be performed on the top surface of the third insulation material 352. The grinding process may be performed until the top surfaces of the first through electrodes 360 are exposed. A portion of the third insulation material 352 remaining after the grinding process may form the first upper protective layer 350. After the grinding process, the top surface of the first upper protective layer 350 and the top surfaces of the first through electrodes 360 may be substantially flat. As described above, the first semiconductor chip 300 may be manufactured. The third insulation material 352 may include a material having a Young's modulus less than that of the first insulation material. The third insulation material 352 may include a material having higher elasticity and/or ductility than the first insulation material. For example, the first upper protective layer 350 may include a polymer. According to embodiments, the third insulation material 352 may include an insulation material having a high Young's modulus (e.g., silicon oxide or silicon nitride).

Figure 14:
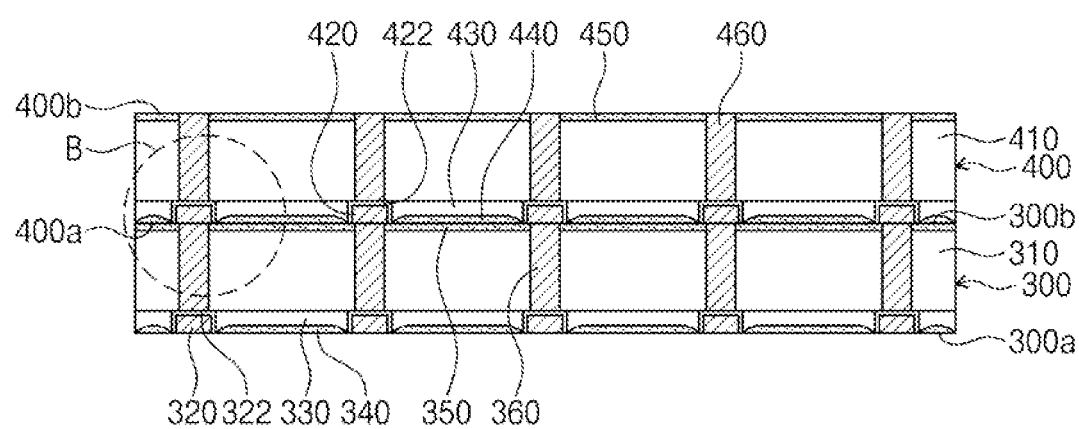
Figure 15:
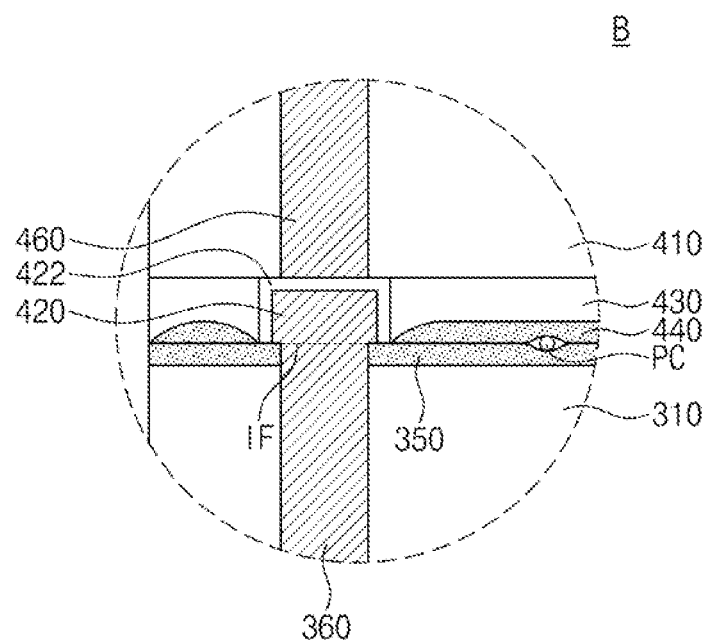

Referring to FIGS. 14 and 15, a second semiconductor chip 400 may be mounted on the first semiconductor chip 300. The method of manufacturing the second semiconductor chip 400 may be equal or similar to the method of manufacturing the first semiconductor chip 300. For example, second chip pads 420, second lower protective layer 430, and second additional protective layer 440 may be formed on a front surface 400a of the second semiconductor chip 400 including a second through electrode 460, which vertically passes through a second base layer 410, and then, a second upper protective layer 450 may be formed on a rear surface 400b of the second semiconductor chip 400.

The second semiconductor chip 400 may be provided on the first semiconductor chip 300. The second semiconductor chip 400 may contact the first semiconductor chip 300. For example, the second chip pads 420 of the second semiconductor chip 400 may contact the first through electrodes 360 of the first semiconductor chip 300. The first upper protective layer 350 of the first semiconductor chip 300 may contact the second additional protective layer 440 of the second semiconductor chip 400.

The second chip pads 420 of the second semiconductor chip 400 may be bonded to the first through electrodes 360 of the first semiconductor chip 300. For example, the second chip pads 420 may be bonded to the first through electrodes 360 to form an integrated body. The bonding of the second chip pads 420 and the first through electrodes 360 may be performed naturally. For example, the second chip pads 420 and the first through electrodes 360 may be made of the same material (e.g., copper (Cu)), and the second chip pads 420 and the first through electrodes 360 may be bonded to each other through a hybrid bonding process between copper (Cu)-copper (Cu)(for example, copper (Cu)-copper (Cu) hybrid bonding) by surface activation on an interface IF of the second chip pads 420 and the first through electrodes 360, which contact each other. The second chip pads 420 and the first through electrodes 360 may be bonded to each other so that the interface between the second chip pads 420 and the first through electrodes 360 disappears.

Here, to more easily bond the second chip pads 420 to the first through electrodes 360, a surface activation process may be performed on the surfaces of the second chip pads 420 and the first through electrodes 360. The surface activation process may include a plasma process. In addition, a pressure and heat may be applied to the second chip pads 420 and the first through electrodes 360 to facilitate the bonding between the second chip pads 420 and the first through electrodes 360. The applied pressure may include, for example, a pressure that is less than about 30 MPa, and the applied heat may a temperature of about 100° C. to about 500° C. in the annealing process. Alternatively, other amounts of pressure and heat may be used for the hybrid bonding process.

In the bonding process of the first semiconductor chip 300 and the second semiconductor chip 400, impurities may be introduced between the first semiconductor chip 300 and the second semiconductor chip 400 according to process environments or process conditions. Referring back to FIG. 15, impurities PC may be interposed between the first semiconductor chip 300 and the second semiconductor chip 400. For example, the impurities PC may be particles generated in the manufacturing processor other process of the semiconductor chips 300, 400, or 500 of FIG. 16 or may be suspended matters in a chamber. The impurities PC may be interposed between the first upper protective layer 350 of the first semiconductor chip 300 and the second additional protective layer 440 of the second semiconductor chip 400. According to the inventive concept, each of the first upper protective layer 350 and the second additional protective layer 440 may include a material having a small Young's modulus. For example, each of the first upper protective layer 350 and the second additional protective layer 440 may include a material having high elasticity and/or ductility. Accordingly, when the first semiconductor chip 300 and the second semiconductor chip 400 are bonded to each other, even if the impurities PC are interposed between the first upper protective layer 350 and the second additional protective layer 440, the first semiconductor chip 300 may be bonded to the second semiconductor chip 400 without spaced portions between the first through electrodes 360 and the second chip pads 420. For example, the first upper protective layer 350 and the second additional protective layer 440 may be deformed according to a shape and size of each of the impurities PC, and it may prevent the first semiconductor chip 300 and the second semiconductor chip 400 from being spaced apart from each other by the impurities PC. Through this, the hybrid bonding between the first through electrodes 360 and the second chip pads 420 may be easily performed. In addition, pores might not be formed in the first through electrodes 360 and the second chip pads 420, which are integrally bonded to each other, and the second semiconductor chip 400 may be mounted on the first semiconductor chip 300 by using the intermetallic bonding with a strong bonding force, thereby improving the structural stability of the semiconductor package. In addition, the second lower protective layer 430 having a high Young's modulus together with the second additional protective layer 440 having a low modulus may be disposed on the front surface of the second semiconductor chip 400 to firmly protect the second semiconductor chip 400, in particular, integrated circuits and the like within the second semiconductor chip 400.

According to embodiments, when the first upper protective layer 350 of the first semiconductor chip 300 is made of an insulation material having a high Young's modulus, the second additional protective layer 440 may be deformed according to the shape and size of each of the impurities PC to prevent the first semiconductor chip 300 and the second semiconductor chip 400 from being spaced apart from each other by the impurities PC.

Figure 16:
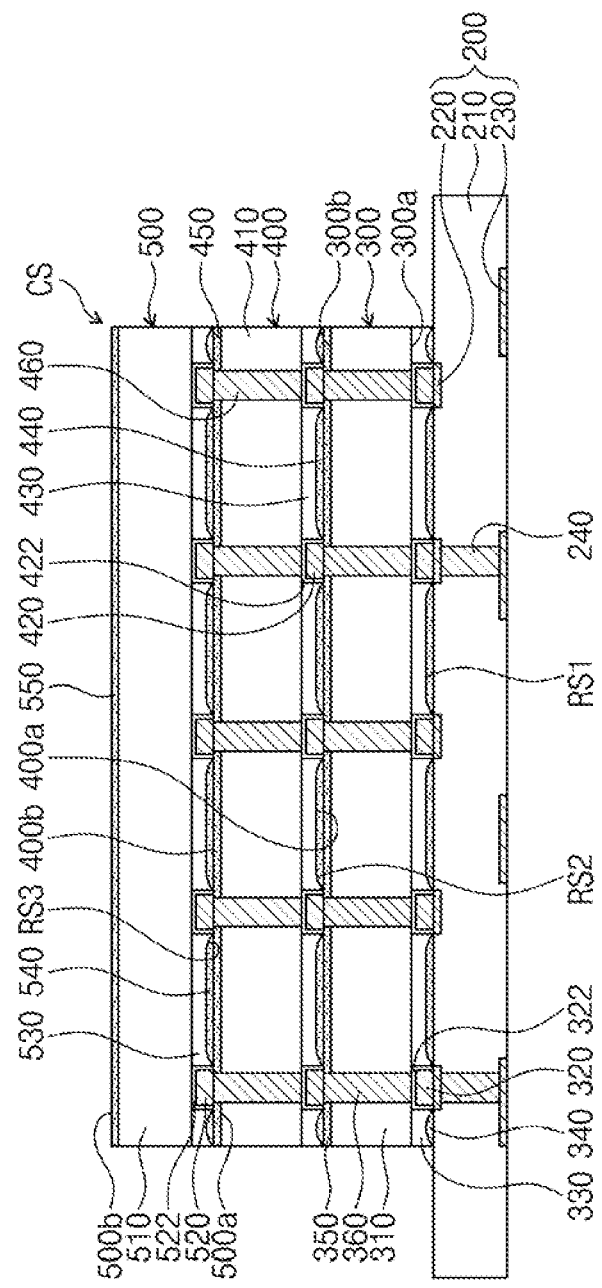

Referring to FIG. 16, a third semiconductor chip 500 may be mounted on the second semiconductor chip 400. A method of manufacturing the third semiconductor chip 500 may be similar to the method of manufacturing the first semiconductor chip 300. For example, third chip pads 520, third lower protective layer 530, and third additional protective layer 540 may be formed on a front surface 500a of the third semiconductor chip 500. Then, as necessary, a third upper protective layer 550 may be formed on a rear surface 500b of the third semiconductor chip 500.

The third semiconductor chip 500 may contact the second semiconductor chip 400. The bonding between the third semiconductor chip 500 and the second semiconductor chip 400 may be equal or similar to the bonding between the second semiconductor chip 400 and the first semiconductor chip 300 described herein with reference to FIG. 14. For example, the third chip pads 520 of the third semiconductor chip 500 may contact the second through electrodes 460 of the second semiconductor chip 400. The second upper protective layer 450 of the second semiconductor chip 400 may contact the third additional protective layer 540 of the third semiconductor chip 500. The second upper protective layer 450 and the third additional protective layer 540 may include a material having a small Young's modulus. For example, the second upper protective layer 450 and the third additional protective layer 540 may include a material having high elasticity and/or ductility. Accordingly, when the second semiconductor chip 400 and the third semiconductor chip 500 are bonded to each other, even if the impurities are interposed between the second upper protective layer 450 and the third additional protective layer 540, the second semiconductor chip 400 may be bonded to the third semiconductor chip 500 without spaced portions between the second through electrodes 460 and the third chip pads 520. As described above, the chip stack CS may be formed.

The chip stack CS may be mounted on the interposer substrate 200. The chip stack CS may contact the interposer substrate 200. For example, the first additional protective layer 340 of the first semiconductor chip 300 may contact the base layer 210 of the interposer substrate 200. The first chip pads 320 of the first semiconductor chip 300 and the first substrate pads 220 of the interposer substrate 200 may be electrically connected to each other. The first chip pads 320 of the first semiconductor chip 300 may be bonded to the first substrate pads 220 of the interposer substrate 200. The first chip pads 320 and the first substrate pads 220 may be coupled through the intermetallic hybrid bonding. Alternatively, unlike the illustrated example, the chip stack CS may be mounted on the interposer substrate 200 in a flip chip manner. For example, the chip stack CS may be electrically connected to the interposer substrate 200 through terminals such as solder balls or solder bumps provided between the first substrate pads 220 of the interposer substrate 200 and the first chip pads 320 of the first semiconductor chip 300.

Referring back to FIG. 1A, substrate connection terminals 250 may be provided on a bottom surface of the interposer substrate 200. The substrate connection terminals 250 may be provided on the second substrate pads 230 provided on the bottom surface of the interposer substrate 200.

Thereafter, the interposer substrate 200 may be mounted on the package substrate 100. The interposer substrate 200 may be mounted in the flip chip manner. For example, the substrate connection terminals 250 provided on the bottom surface of the interposer substrate 200 may be connected to pads provided on a top surface of the package substrate 100. As described above, the semiconductor package may be manufactured.

Figure 17:
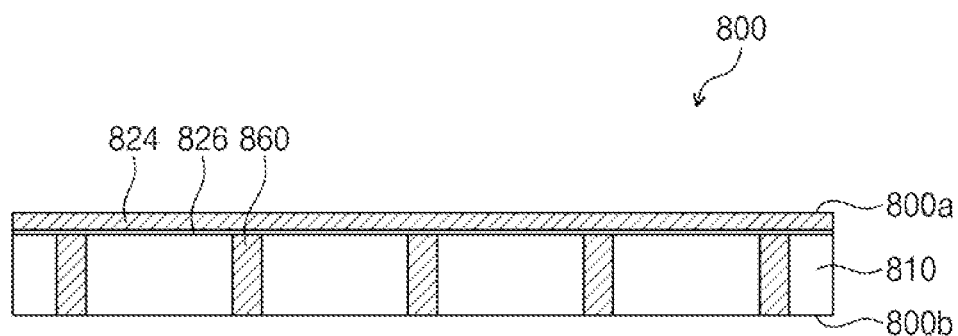
FIGS. 17 to 19 are views illustrating a method for manufacturing a semiconductor package including a protective layer made of a polymer.
Figure 18:
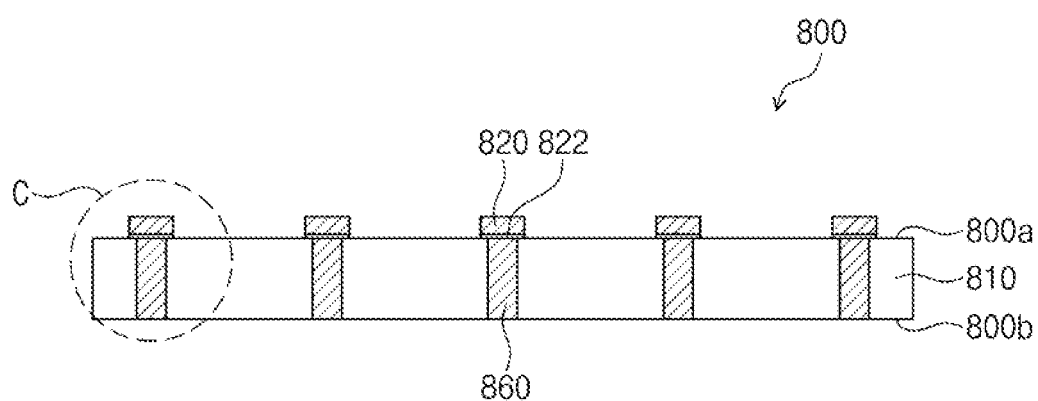
Figure 19:
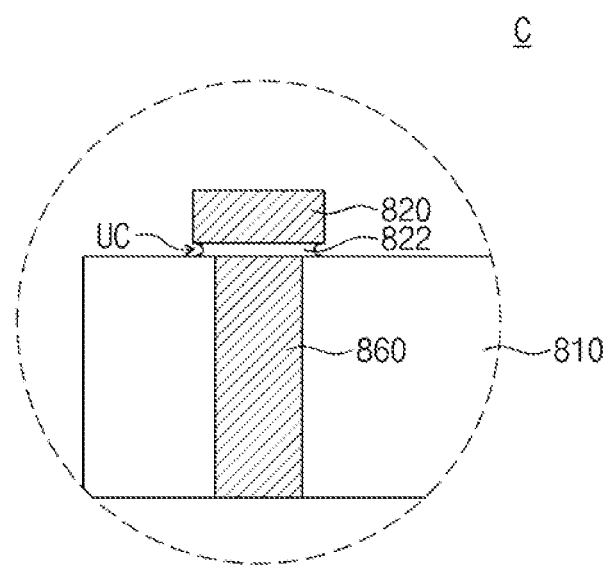

FIGS. 17 to 19 are views illustrating a method of manufacturing the semiconductor package including the protective layers made of only a polymer.

When protective layers of semiconductor chips (particularly, a lower protective layer covering an entire surface of the semiconductor chips) are to be made of a polymer, chip pads may be formed first before forming a lower protective layer. This is done because a Young's modulus of the polymer is low, and thus it is difficult to pattern the lower protective layer made of the polymer so as to form holes filled with the pads. The process of forming the chip pads in the above case will be described in detail below.

Referring to FIG. 17, a semiconductor chip 800 including through electrodes 860 that pass through a base layer 810 may be provided. A seed layer 826 and a conductive layer 824 may be sequentially formed on the semiconductor chip 800. For example, after the seed layer 826 is formed on a front surface 800a of the semiconductor chip 800, a plating process may be performed using the seed layer 826 as a seed. Alternatively, the conductive layer 824 may be deposited on the front surface 800a of the semiconductor chip 800.

Referring to FIGS. 18 and 19, the conductive layer 824 and the seed layer 826 may be patterned to form chip pads 820 and seed layers 822. For example, after a mask pattern is formed on the conductive layer 824, the conductive layer 824 and the seed layer 826 may be sequentially etched using the mask pattern as an etching mask. Here, as illustrated in FIG. 19, an undercut area UC may be formed under the chip pads 820. For example, after the conductive layer 824 is etched, the seed layer 826 may be over-etched. The chip pads 820 may have poor adhesion with the through electrodes 860 and the base layer 810 by the undercut area UC, and after the lower protective layer is formed in a later process, pores may be formed in the undercut area UC.

On the other hands, the seed layer 826 may be formed in a hole formed by applying a photosensitive layer on the front surface 800a of the semiconductor chip 800 and patterning the photosensitive layer. The chip pads 820 may be formed by filling a conductive material in the hole through the plating process using the seed layer 826 as the seed. Thereafter, the photosensitive layer may be removed, and the lower protective layer may be formed by depositing a polymer material. Even in this case, a portion of the seed layer 826 may be removed together in the process of removing the photosensitive layer, and as illustrated in FIG. 19, the undercut area UC may be formed under the chip pads 820.

Figure 20:
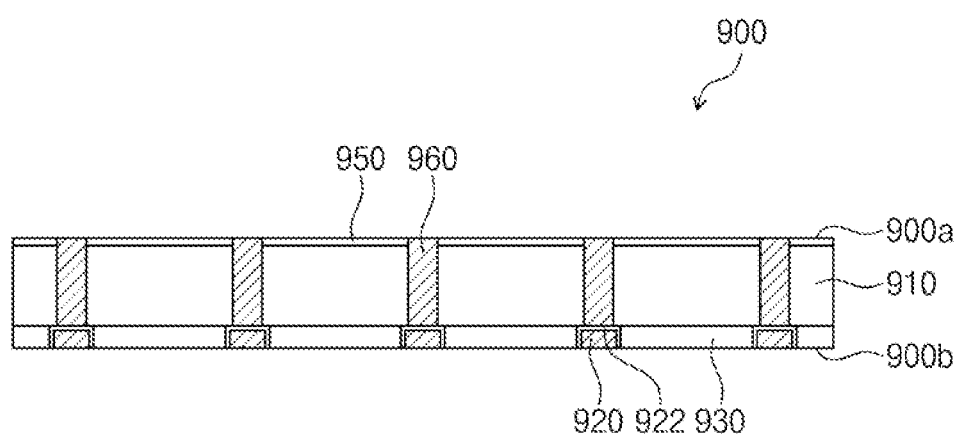
FIGS. 20 to 22 are views illustrating a method for manufacturing a semiconductor package including a protective layer made of an oxide.
Figure 21:
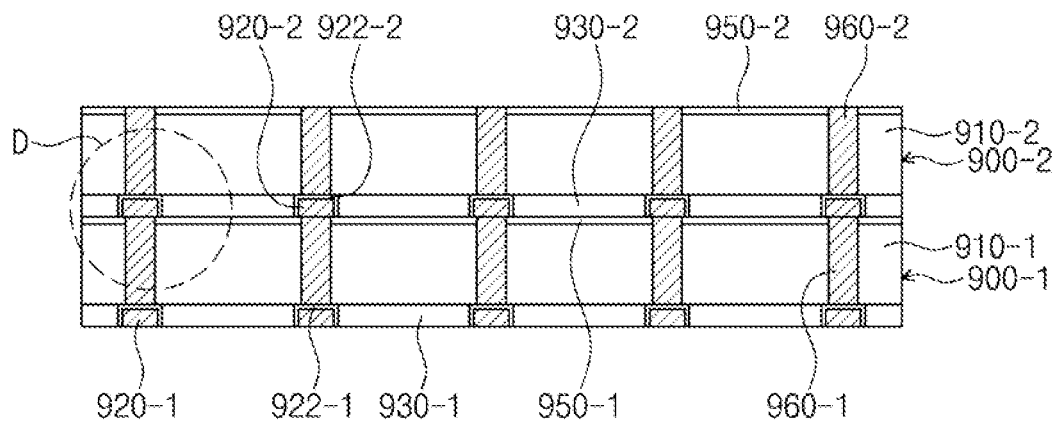
Figure 22:
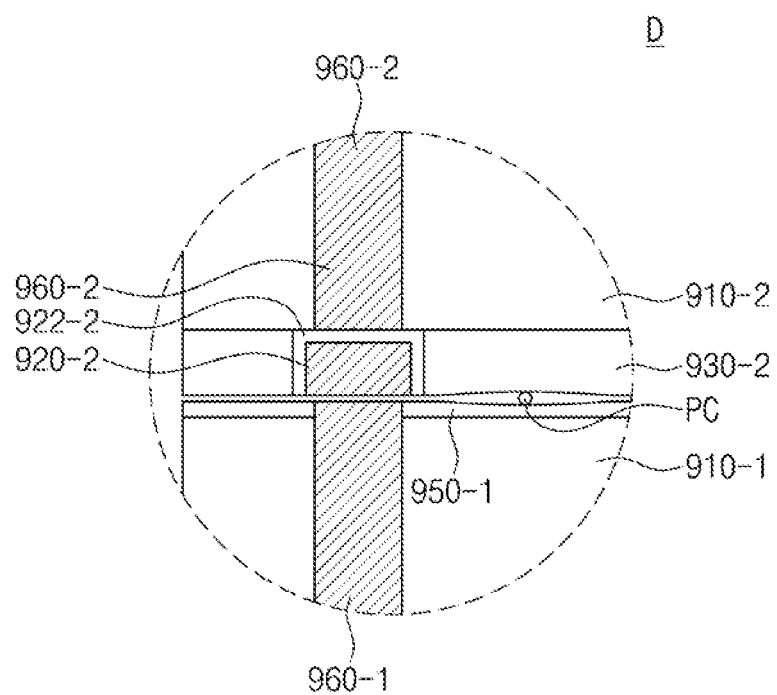

FIGS. 20 to 22 are views illustrating a method of manufacturing the semiconductor package including protective layers made of only oxide.

Referring to FIG. 20, as illustrated in the result of FIG. 9, a seed layer 922, chip pads, and a lower protective layer 930 may be formed on a front surface 900a of a semiconductor chip 900 including a through electrode 960 passing through a base layer 910. In this case, an additional protective layer might not be formed. An upper protective layer 950 may be formed on a rear surface 900b of the semiconductor chip 900 by using the processes described herein with reference to FIGS. 12 and 13. Here, each of the lower protective layer 930 and the upper protective layer 950 may include an insulation material having a high Young's modulus. For example, each of the lower protective layer 930 and the upper protective layer 950 may include silicon oxide, silicon nitride, or silicon carbonitride.

Referring to FIG. 21, semiconductor chips 900 may be stacked. One semiconductor chip 900-2 may contact the other semiconductor chip 900-1. For convenience of description, the following semiconductor chip is referred to as a lower semiconductor chip 900-1, and a semiconductor chip stacked thereon is referred to as an upper semiconductor chip 900-2. Through electrodes 960-1 of the lower semiconductor chip 900-1 and chip pads 920-2 of the upper semiconductor chip 900-2 may contact each other. An upper protective layer 950-1 of the lower semiconductor chip 900-1 may contact a lower protective layer 930-2 of the upper semiconductor chip 900-2. In a bonding process of the lower semiconductor chip 900-1 and the upper semiconductor chip 900-2, impurities PC may be introduced between the lower semiconductor chip 900-1 and the upper semiconductor chip 900-2 according to process environments or process conditions. As illustrated in FIG. 22, in the bonding process of the lower semiconductor chip 900-1 and the upper semiconductor chip 900-2, the impurities PC form pores or gaps in an interface between the lower semiconductor chip 900-1 and the upper semiconductor chip 900-2. For example, the lower protective layers 930-1 and 930-2 and the upper protective layers 950-1 and 950-2, each of which has a high Young's modulus, may be difficult to be deformed according to a shape and size of each of impurity PC. Accordingly, the lower semiconductor chip 900-1 and the upper semiconductor chip 900-2 might not completely contact each other, and the through electrodes 960-1 of the lower semiconductor chip 900-1 and the chip pads 920-2 of the upper semiconductor chip 900-2 may be spaced apart from each other. In this case, hybrid bonding between the through electrodes 960-1 of the lower semiconductor chip 900-1 and the chip pads 920-2 of the upper semiconductor chip 900-2 may be difficult. Therefore, bonding force between the through electrodes 960-1 of the lower semiconductor chip 900-1 and the chip pads 920-2 of the upper semiconductor chip 900-2 may decrease and/or contact failure therebetween may occur.

According to the embodiments of the inventive concept, the chip pads having the narrow width and interval may be formed using the lower protective layers having the high Young's modulus. In addition, the additional protective layers having the low Young's modulus and the upper protective layer may contact each other on the interface between the semiconductor chips. Therefore, the hybrid bonding between the through electrodes and the chip pads may be stably performed even though the impurities and the like are interposed between the semiconductor chips in the stacking process of the semiconductor chips.

In the semiconductor package, according to the embodiments of the inventive concept, the upper protective layer and the additional protective layer of the semiconductor chips may include the material having the low Young's modulus. As a result, when the semiconductor chips are bonded, the through electrodes and the chip pads may be bonded to each other without the gap between the upper protective layer and the additional protective layer. In addition, since the additional protective layer and the upper protective layer of the semiconductor chips in contact with each other may be made of the highly adhesive material, the semiconductor chips may be firmly bonded. As a result, the structural stability of the semiconductor package may be increased.

In addition, the lower protective layer with the high Young's modulus may be disposed on the front surface of the semiconductor chip together with the additional protective layer with the low modulus to firmly protect the semiconductor chip.

According to the embodiments of the inventive concept, it may be easy to form the chip pads having the small width or the small gap. Accordingly, high integration of the semiconductor package may be achieved and the semiconductor package may be miniaturized.

Although the embodiment of the inventive concept is described herein with reference to the accompanying drawings, those with ordinary skill in the technical field of the inventive concept pertains will be understood that the present disclosure can be carried out in other specific forms without changing the technical idea or essential features.

What is claimed is:

1. A method for manufacturing a semiconductor package, comprising:
    mounting, on a substrate, a first semiconductor chip having a through electrode;
    forming a second semiconductor chip;
    disposing the second semiconductor chip on the first semiconductor chip such that a chip pad of the second semiconductor chip is in contact with the through electrode of the first semiconductor chip; and
    forming a molding layer on the substrate,
    wherein the forming of the second semiconductor chip includes:
        forming a lower protective layer of a first insulation material on a bottom surface of a base layer having an integrated circuit;
        forming the chip pad connected to the base layer through the lower protective layer;
        etching a bottom surface of the lower protective layer to form a recess; and
        filling an inside of the recess with a second insulation material to form an additional protective layer,
    wherein a ductility of the second insulation material is greater than a ductility of the first insulation material, and
    wherein, after disposing the second semiconductor chip on the first semiconductor chip, the through electrode and the chip pad are coupled to each other.

2. The method for manufacturing a semiconductor package as claimed in claim 1,
    wherein the first semiconductor chip further comprises an upper protective layer covering a top surface of the first semiconductor chip and surrounding the through electrode, and
    wherein the additional protective layer and the upper protective layer contact each other.

3. The method for manufacturing a semiconductor package as claimed in claim 2, wherein a bottom surface of the additional protective hirer is substantially flat and coplanar with a bottom surface of the chip pad, and wherein a top surface of the upper protective layer is substantially flat and coplanar with a top surface of the through electrode.

4. The semiconductor package of claim 2, wherein the through electrode has a width that is less than that of the chip pad.

5. The semiconductor package of claim 4, wherein the upper protective layer contacts a bottom surface of the chip pad.

6. The method for manufacturing a semiconductor package as claimed in claim 1, wherein the additional protective layer at least partially overlaps the lower protective layer in a plan view.

7. The method for manufacturing a semiconductor package as claimed in claim 1, wherein the additional protective layer has a top surface that is rounded upward toward the second semiconductor chip.

8. The method for manufacturing a semiconductor package as claimed in claim 1, wherein the additional protective layer surrounds the chip pad and contacts a lower portion of the chip pad.

9. The method for manufacturing a semiconductor package as claimed in claim 1, wherein the recess has a depth corresponding to about $1/2$ to about $1/10$ of a thickness of the lower protective layer.

10. The method for manufacturing a semiconductor package as claimed in claim 1, wherein a Young's modulus of the additional protective layer is about 0.1 times to about 0.5 times as great as a Young's modulus of the lower protective layer.

11. The method for manufacturing a semiconductor package as claimed in claim 1, wherein the lower protective layer comprises an oxide and/or a nitride, and
    wherein the additional protective layer comprises a polymer.

12. A method for manufacturing a semiconductor package, comprising:
    mounting, on a substrate, a first semiconductor chip having a through electrode;
    forming a second semiconductor chip;
    disposing the second semiconductor chip on the first semiconductor chip such that a drip pad of the second semiconductor chip is in contact with the through electrode of the first semiconductor chip; and
    forming a molding layer on the substrate,
    wherein the forming of the second semiconductor chip includes:
        forming a lower protective layer of a first insulation material on a bottom surface of a base layer having an integrated circuit;
        forming the chip pad connected to the base layer through the lower protective layer; and
        forming an additional protective layer of a second insulation material on the lower protective layer,
    wherein a Young's modulus of the additional protective layer is about 0.1 times to about 0.5 times as great as a Young's modulus of the lower protective layer, and
    wherein, after disposing the second semiconductor chip on the first semiconductor chip, the through electrode and the chip pad are coupled to each other.

13. The method fir manufacturing a semiconductor package as claimed in claim 12,
    wherein the lower protective layer includes a first insulation material,
    wherein the additional protective layer includes a second insulation material, and wherein a ductility of the second insulation material is greater than a ductility of the first insulation material.

14. The method for manufacturing a semiconductor package as claimed in claim 13,
    wherein the first insulation comprises an oxide and/or a nitride, and
    wherein the second insulation material comprises a polymer.

15. The method for manufacturing a semiconductor package as claimed in claim 12, wherein forming an additional protective layer includes:
    etching a bottom surface of the lower protective layer to form a recess; and
    filling an inside of the recess with a second insulation material to form the additional protective layer.

16. The method for manufacturing a semiconductor package as claimed in claim 12,
    wherein the first semiconductor chip further comprises an upper protective layer covering a top surface of the first semiconductor chip and surrounding the through electrode, and
    wherein the additional protective layer and the upper protective layer contact each other.

17. The method for manufacturing a semiconductor package as claimed in claim 16, wherein a bottom surface of the additional protective layer is substantially flat and coplanar with a bottom surface of the chip pad, and
    wherein a top strike of the upper protective layer is substantially flat and coplanar with a top surface of the through electrode.

18. The method for manufacturing a semiconductor package as claimed in claim 12, wherein the additional protective layer at least partially overlaps the lower protective layer in a plan view.

19. The method for manufacturing a semiconductor package as claimed in claim 12, wherein the additional protective layer has a top surface that is rounded upward toward the second semiconductor chip.

20. The method fir manufacturing a semiconductor package as claimed in claim 12, wherein the additional protective layer surrounds the chip pad and contacts a lower portion of the chip pad.

* * * * *